US012100599B2

(12) United States Patent
Hu et al.

(10) Patent No.: US 12,100,599 B2
(45) Date of Patent: Sep. 24, 2024

(54) WET ETCH PROCESS AND METHOD TO PROVIDE UNIFORM ETCHING OF MATERIAL FORMED WITHIN FEATURES HAVING DIFFERENT CRITICAL DIMENSION (CD)

(71) Applicant: Tokyo Electron Limited, Tokyo (JP)

(72) Inventors: Shan Hu, Albany, NY (US); Henan Zhang, Albany, NY (US); Sangita Kumari, Albany, NY (US); Peter Delia, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 184 days.

(21) Appl. No.: 17/942,359

(22) Filed: Sep. 12, 2022

(65) Prior Publication Data
US 2024/0087908 A1    Mar. 14, 2024

(51) Int. Cl.
*H01L 21/311*    (2006.01)
*H01L 21/306*    (2006.01)
*H01L 21/3213*    (2006.01)

(52) U.S. Cl.
CPC .. *H01L 21/31111* (2013.01); *H01L 21/30604* (2013.01); *H01L 21/32134* (2013.01)

(58) Field of Classification Search
None
See application file for complete search history.

(56) References Cited

U.S. PATENT DOCUMENTS

| 3,979,241 | A | 9/1976 | Maeda et al. |
| 7,192,910 | B2 | 3/2007 | Wojtczak et al. |
| 8,193,005 | B1 | 6/2012 | Parrish et al. |
| 8,470,191 | B2 | 6/2013 | Mayer et al. |
| 9,865,598 | B1* | 1/2018 | Bi ..................... H01L 21/31144 |
| 2013/0203263 | A1* | 8/2013 | Shimada ................. H01L 29/78 252/79.1 |
| 2018/0138053 | A1 | 5/2018 | Yao et al. |
| 2021/0265172 | A1* | 8/2021 | Fu ..................... H01L 21/76883 |
| 2021/0272816 | A1 | 9/2021 | Tsai et al. |
| 2021/0407794 | A1* | 12/2021 | Chang ................. H01L 21/0337 |
| 2022/0098485 | A1 | 3/2022 | Vereecke |
| 2022/0130722 | A1* | 4/2022 | Parikh ............... H01L 21/76816 |

OTHER PUBLICATIONS

Monteiro et al., "Dynamic Wet Etching of Silicon Through Isopropanol Alcohol Evaporation", MDPI, Micromachines, Oct. 2015, 12 pgs.
Search Report and The Written Opinion mailed Nov. 20, 2023, Application No. PCT/US2023/028924, Filed Jul. 28, 2023, 11 pgs.

(Continued)

*Primary Examiner* — Shamim Ahmed
(74) *Attorney, Agent, or Firm* — Egan, Enders & Huston LLP.

(57) ABSTRACT

Embodiments of a wet etch process and method are disclosed to provide uniform etching of material formed within features (such as, e.g., trenches, holes, slits, etc.) having different critical dimension (CD). By combining a non-aqueous organic-based etch solution and an aqueous-based etch solution (either in series or in parallel) within a wet etch process, the disclosed embodiments utilize the opposing effects of CD-dependent etching to provide uniform etching of the material, regardless of CD.

20 Claims, 12 Drawing Sheets

(56) References Cited

OTHER PUBLICATIONS

Ueda, "Effect of Hydrophobicity and Surface Potential of Silicon on SiO2 Etching in Nonometer-Sized Narrow Spaces", Trans Tech Publications, 2021, 6 pgs.
Watanabe et al., "High Selectively (SiN/SiO2) Etching Using an Organic Solution Containing Anhydroud HF", Microelectronic Engineering, 2009, 1 pg.
Okuyama et al., "Impact of Electrostatic Effects on Wet Etching Phenomenon in Nanoscale Region", Trans Tech Publications, 2015, 5 pgs.
Polster et al., "The Electrical-Double Layer Revisted", Natural Sciences, Dec. 2021, 10 pgs.
Zubel et al., "Silicon Anisotropic Etching in Alkaline Solutions IV: The Effect of Organic and Inorganic Agents on Silicon Anisotropic Etching Process", Sensors and Actuators a Physical, Jan. 2001, 1 pg.
MicroChemicals, "Wet-Chemical Etching of Silicon and Sio2", Anisotropic Etching of Silicon, Basics of Microstructuring, Obtained from Internet Jul. 12, 2022, 7 pgs.
MicroChemicals, "Wet Chemical Etching—Basics", Basics of Microstructuring, Obtained from Internet Jul. 12, 2022, 8 pgs.
Virginia Semiconductor, "Wet-Chemical Etching and Cleaning of Silicon", Jan. 2003, 11 pgs.
Li et al., "Evaluation on Dispersion Behavior of the Aqueous Copper Nano-Suspensions", Journal of Colloid and Interface Science, Mar. 2007, 9 pgs.

\* cited by examiner

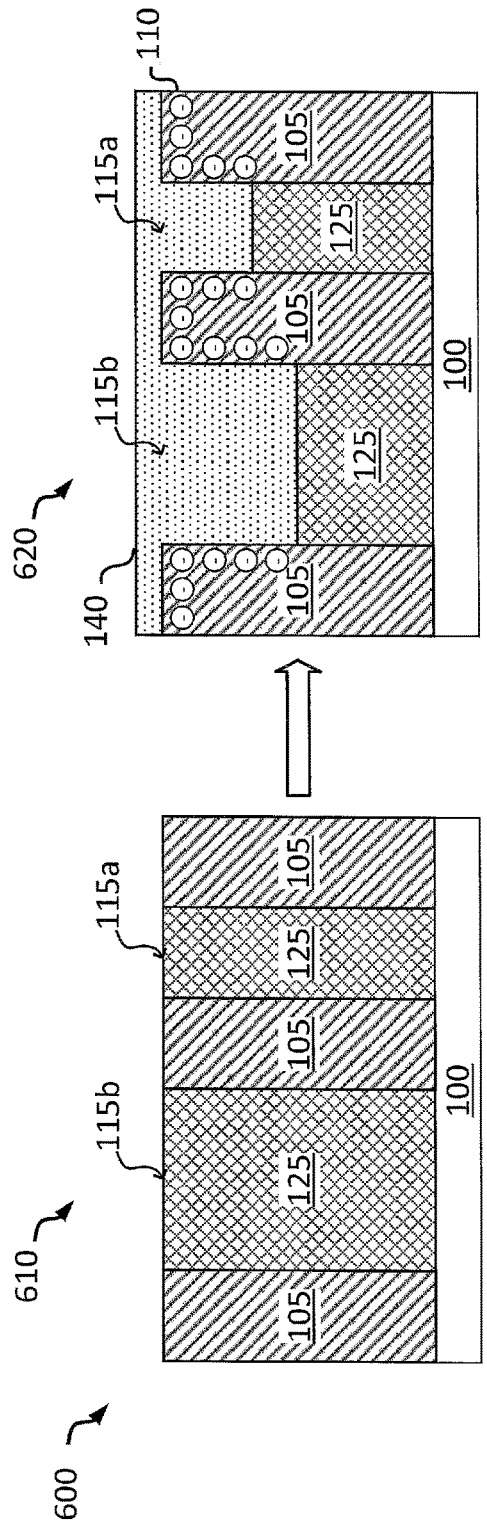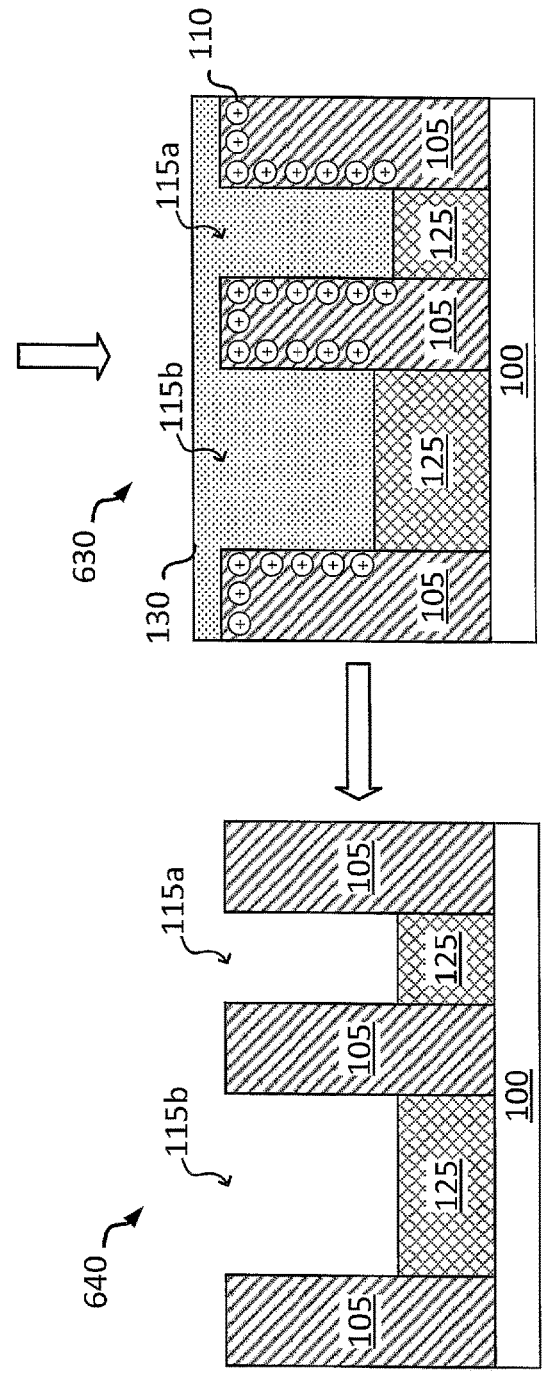

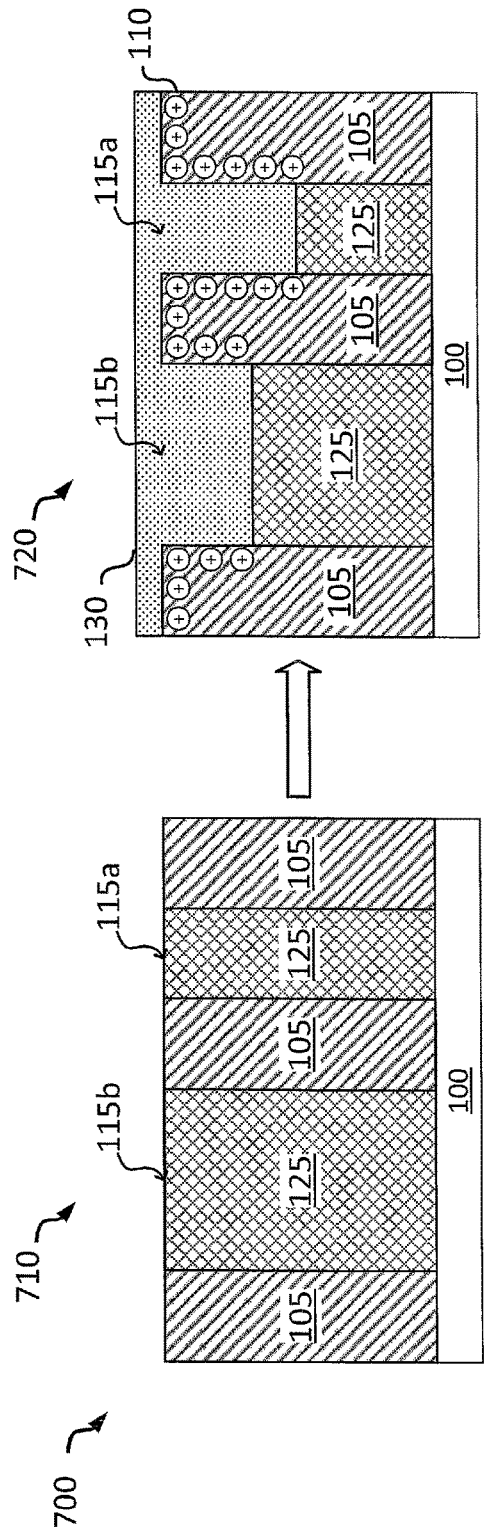
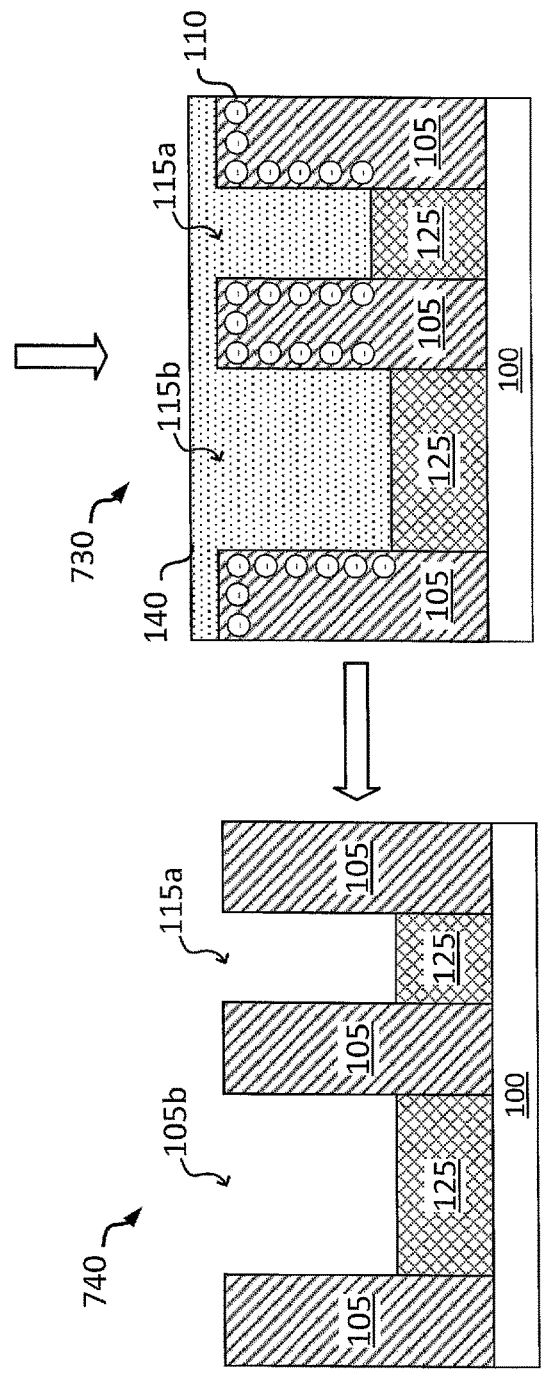
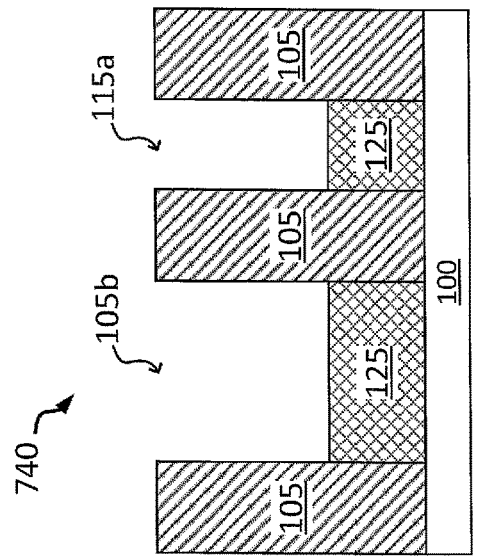
FIG. 7A FIG. 7B FIG. 7C FIG. 7D

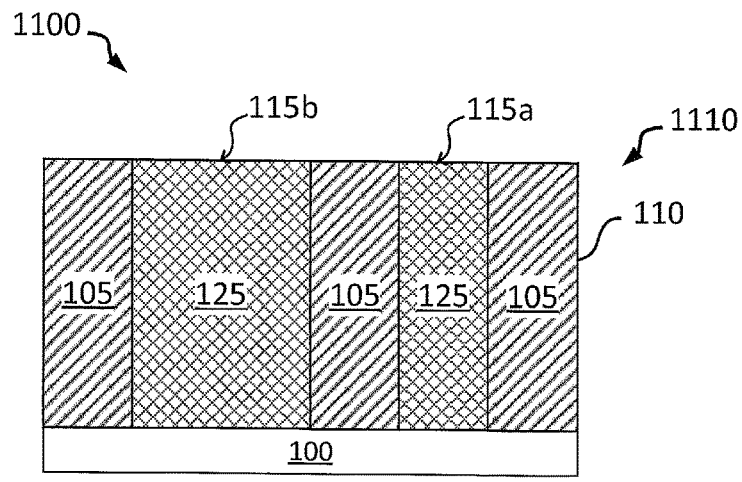
FIG. 11A
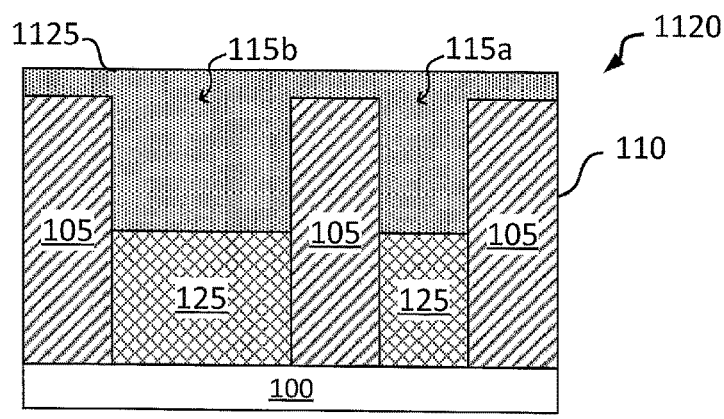
FIG. 11B
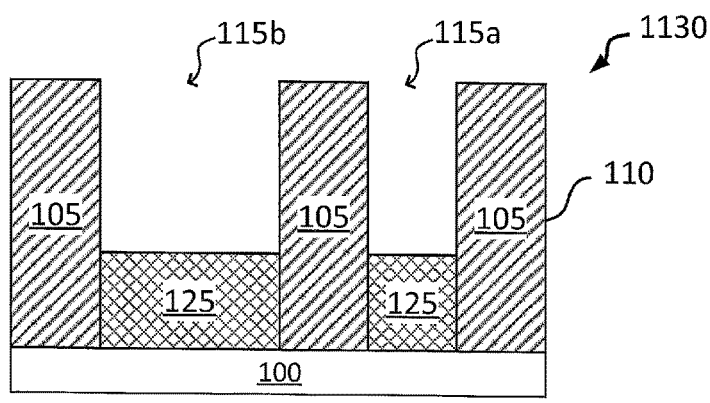
FIG. 11C

1300

┌─────────────────────────────────────────────┐
│ Providing a substrate having a plurality of features, │
│ wherein a critical dimension (CD) of the plurality of │
│ features is different for one or more of the features, such │ ⟶ 1310
│ that the plurality of features comprise at least a first │
│ feature having a smaller CD and a second feature having a │
│ larger CD │
└─────────────────────────────────────────────┘
                              │
                              ▼
┌─────────────────────────────────────────────┐
│ Exposing the substrate to one or more etch solutions in │
│ series, or in parallel, to etch a material formed within the │
│ plurality of features, │
│ wherein the one or more etch solutions comprise an │
│ etchant chemical, an aqueous solvent and an organic │ ⟶ 1320
│ solvent, wherein the organic solvent is an alcohol, a │
│ polyhydric alcohol, acetic acid or a ketone, and │
│ wherein said exposing the substrate to the one or more │
│ etch solutions in series, or in parallel, provides uniform │
│ etching of the material formed within the plurality of │
│ features, regardless of CD. │
└─────────────────────────────────────────────┘

- Providing a substrate having a plurality of features, wherein a critical dimension (CD) of the plurality of features is different for one or more of the features, such that the plurality of features comprise at least a first feature having a smaller CD and a second feature having a larger CD — 1410

- Exposing the substrate to a first etch solution and a second etch solution in series to etch a material formed within the plurality of features, wherein the first etch solution includes an etchant chemical mixed with an organic solvent, wherein the second etch solution includes the etchant chemical mixed with an aqueous solvent, and wherein said exposing the substrate to the first etch solution and the second etch solution in series provides uniform etching of the material formed within the plurality of features, regardless of CD. — 1420

*FIG. 14*

WET ETCH PROCESS AND METHOD TO PROVIDE UNIFORM ETCHING OF MATERIAL FORMED WITHIN FEATURES HAVING DIFFERENT CRITICAL DIMENSION (CD)

BACKGROUND

The present disclosure relates to the processing of substrates. In particular, it provides methods for adjusting the etch rate of wet etch processes used to remove material from features having different critical dimensions (CD).

Semiconductor device formation typically involves a series of manufacturing techniques related to the formation, patterning, and removal of layers of material on a substrate. During routine semiconductor fabrication, various materials formed on a substrate may be removed by patterned etching, chemical-mechanical polishing, as well as other techniques. A variety of techniques are known for etching layers on a substrate, including plasma-based or vapor-phase etching (otherwise referred to as dry etching) and liquid based etching (otherwise referred to as wet etching).

Wet etching generally involves dispensing a chemical solution over the surface of a substrate or immersing the substrate in the chemical solution. The chemical solution (otherwise referred to herein as an etch solution) often contains a solvent and etchant chemical(s) designed to react with materials on the substrate surface and promote dissolution of the reaction products. As a result of exposure of the substrate surface to the etch solution, material is removed from the substrate. The composition and temperature of the etch solution may be controlled to control the etch rate, specificity, and residual material on the surface of the substrate post-etch.

As geometries of substrate structures continue to shrink and the types of structures evolve, the challenges of etching substrates have increased. One such challenge is CD-dependent etching of material formed within narrow features (such as, e.g., trenches, holes, slits, etc.). In many applications, features having different critical dimensions (CDs) may be formed across a substrate. When a wet etch process is utilized to remove material from within such features, the etch rate of the material within features having smaller CD differs from the etch rate of the material within features having larger CD and blanket areas of the substrate. This CD-dependent etching results in an uneven etch rate, and an uneven removal of material, across the substrate.

SUMMARY

The present disclosure provides various embodiments of a wet etch process and method to provide uniform etching of material, which is formed within features (such as, e.g., trenches, holes, slits, etc.) having different critical dimension (CD). When an etch solution is used to remove the material within the features, the rate at which the material is removed from one or more of the features (i.e., the etch rate) may differ depending on a variety of factors, such as the CD of the features, the etchant chemical(s) used within the etch solution, the solvent used within the etch solution, the ratio of etchant chemical(s) to solvent used within the etch solution, the pH of the etch solution and the wall material adjacent to the material being etched. The difference in etch rate across features of different CD is known in the art as CD-dependent etching.

The embodiments described in the present disclosure provide uniform etching of material formed within features of different CD by exposing a substrate comprising the features to an aqueous-based etch solution and a non-aqueous organic-based etch solution, either in series or in parallel. The aqueous-based etch solution is one that includes one or more etchant chemicals and an aqueous solvent. The non-aqueous organic-based etch solution, on the other hand, includes one or more etchant chemicals and organic solvent. In some embodiments, the wet etch process and method disclosed herein may provide uniform etching of the material within the features of different CD by exposing the substrate to a single etch solution comprising an etchant chemical(s), an aqueous solvent and an organic solvent, instead of exposing the substrate to an aqueous-based etch solution and a non-aqueous organic-based etch solution (either in series or in parallel).

When the substrate is exposed to a non-aqueous organic-based etch solution, the material may be etched faster within features having smaller CD and slower within features having larger CD. In other words, the etch rate may be increased within features having smaller CD and decreased within features having larger CD when non-aqueous organic-based etch solutions are used. When the substrate is exposed to an aqueous-based etch solution, the etch rate may be decreased in features having smaller CD and increased in features having larger CD. Thus, in some embodiments, non-aqueous organic-based etch solutions and aqueous-based etch solutions may have the opposite effect on etch rate.

The present disclosure takes advantage of the difference in etch rate that occurs when non-aqueous organic-based etch solutions and aqueous-based etch solutions are used to etch a material formed within features (e.g., trenches, holes, slits, etc.) having different CD. By combining a non-aqueous organic-based etch solution and an aqueous-based etch solution (either in series or in parallel) within a wet etch process, the disclosed embodiments utilize the opposing effects of CD-dependent etching to provide uniform etching of the material regardless of CD. In some embodiments, the ratio of the etchant chemical(s) to the solvent used within the etch solution and/or the pH of the etch solution may also be controlled to provide uniform etching of the material formed within the features of different CD.

According to one embodiment, a method of etching is provided that utilizes the techniques described in the present disclosure. In some embodiments, the method may begin by providing a substrate having a plurality of features. A critical dimension (CD) of the plurality of features may be different for one or more of the features, such that the plurality of features include at least a first feature having a smaller CD and a second feature having a larger CD.

Next, the method may include exposing the substrate to one or more etch solutions in series, or in parallel, to etch a material formed within the plurality of features. The one or more etch solutions may generally include an etchant chemical, an aqueous solvent and an organic solvent, wherein the organic solvent is an alcohol, a polyhydric alcohol, acetic acid or a ketone. By exposing the substrate to the one or more etch solutions, either in series or in parallel, the method described herein provides uniform etching of the material formed within the plurality of features, regardless of CD.

In some embodiments, the material formed within the plurality of features may be an oxide, a dielectric material, a silicon or a metal. In one example embodiment, the material formed within the plurality of features (i.e., the material to be etched) may be silicon dioxide ($SiO_2$). In some embodiments, a wall material of the plurality of features may comprise a silicon-containing material, which exhibits a negative surface potential when exposed to aqueous solutions in a certain pH range. For example, the wall material may include amorphous silicon (a-Si), polysilicon (poly-Si), silicon carbon nitride (SiCN) or silicon oxynitride (SiON).

In some embodiments, said exposing the substrate to the one or more etch solutions may include exposing the substrate to a first etch solution comprising the etchant chemical and the organic solvent, and exposing the substrate to a second etch solution comprising the etchant chemical and the aqueous solvent. In some embodiments, the etchant chemical may include one or more of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH). The aqueous solvent may be water and the organic solvent may be isopropyl alcohol ($C_3H_8O$), propylene carbonate ($C_4H_6O_3$), acetic acid ($CH_3COOH$) or ethylene glycol ($C_2H_6O_2$).

In some embodiments, the etchant chemical may include anions as a main reactive species. When anions are utilized as the main reactive species, exposing the substrate to the first etch solution etches the material formed within the first feature faster than the material formed within the second feature, while exposing the substrate to the second etch solution etches the material formed within the first feature slower than the material formed within the second feature. Thus, by exposing the substrate to the first etch solution and exposing the substrate to the second etch solution, the material formed within the first feature and the material formed within the second feature are etched at a uniform etch rate.

When the substrate is exposed to the first etch solution and the etchant chemical utilized within the first etch solution includes anions as the main reactive species, the etch rate of the material formed within the first feature and the second feature is increased. In this case, the increase in the etch rate may be more pronounced within the first feature having the smaller CD and less pronounced within the second feature having the larger CD. When the substrate is exposed to the second etch solution and the etchant chemical utilized within the second etch solution includes anions as the main reactive species, the etch rate of the material formed within the first feature and the second feature is decreased. In this case, the decrease in the etch rate may be more pronounced within the first feature having the smaller CD and less pronounced within the second feature having the larger CD.

In other embodiments, the etchant chemical may include cations as a main reactive species, instead of anions. When cations are utilized as the main reactive species, exposing the substrate to the first etch solution etches the material formed within the first feature slower than the material formed within the second feature, while exposing the substrate to the second etch solution etches the material formed within the first feature faster than the material formed within the second feature. Thus, by exposing the substrate to the first etch solution and exposing the substrate to the second etch solution, the material formed within the first feature and the material formed within the second feature are etched at a uniform etch rate.

When the substrate is exposed to the first etch solution and the etchant chemical utilized within the first etch solution includes cations as the main reactive species, the etch rate of the material formed within the first feature and the second feature is decreased. In this case, the decrease in the etch rate may be more pronounced within the first feature having the smaller CD and less pronounced within the second feature having the larger CD. When the substrate is exposed to the second etch solution and the etchant chemical utilized within the second etch solution includes cations as the main reactive species, the etch rate of the material formed within the first feature and the second feature is increased. In this case, the increase in the etch rate may be more pronounced within the first feature having the smaller CD and less pronounced within the second feature having the larger CD.

In some embodiments of the method described, the substrate may be exposed to the one or more etch solutions in series. In some embodiments, for example, said exposing the substrate to the one or more etch solutions may include exposing the substrate to the first etch solution during a first time period before subsequently exposing the substrate to the second etch solution during a second time period, which occurs at least partially after the first time period. In other embodiments, said exposing the substrate to the one or more etch solutions may include exposing the substrate to the second etch solution during a first time period before subsequently exposing the substrate to the first etch solution during a second time period, which occurs at least partially after the first time period.

In other embodiments of the method described herein, the substrate may be exposed to the one or more etch solutions in parallel. In some embodiments, for example, said exposing the substrate to the one or more etch solutions may include exposing the substrate to the first etch solution and exposing the substrate to the second etch solution at substantially the same time or during overlapping time periods. In other embodiments, said exposing the substrate to one or more etch solutions may include exposing the substrate to a single etch solution comprising the etchant chemical, the aqueous solvent and the organic solvent, wherein said exposing the substrate to the single etch solution etches the material within the first feature and the second feature at a uniform etch rate.

According to another embodiment, another method of etching is provided that utilizes the techniques described in the present disclosure. In some embodiments, the method may begin by providing a substrate having a plurality of features, wherein a critical dimension (CD) of the plurality of features is different for one or more of the features, such that the plurality of features include at least a first feature having a smaller CD and a second feature having a larger CD.

Next, the method may include exposing the substrate to a first etch solution and a second etch solution in series to etch a material formed within the plurality of features. The first etch solution includes an etchant chemical mixed with an organic solvent. The second etch solution includes the etchant chemical mixed with an aqueous solvent. By exposing the substrate to the first etch solution and the second etch solution in series, the method described herein provides uniform etching of the material formed within the plurality of features, regardless of CD.

In some embodiments, said exposing the substrate to the first etch solution and the second etch solution in series may include exposing the substrate to the first etch solution during a first time period, and subsequently exposing the substrate to the second etch solution during a second time period, which occurs at least partially after the first time period. Exposing the substrate to the first etch solution etches the material formed within the first feature faster than the material formed within the second feature. When the substrate is subsequently exposed to the second etch solution, the second etch solution etches the material formed within the first feature slower than the material formed within the second feature. Thus, by exposing the substrate to the first etch solution and subsequently exposing the substrate to the second etch solution, the method described herein etches the material formed within the first feature and the material formed within the second feature at a uniform etch rate.

In other embodiments, said exposing the substrate to the first etch solution and the second etch solution in series may include exposing the substrate to the second etch solution during a first time period, and subsequently exposing the substrate to the first etch solution during a second time period, which occurs at least partially after the first time period. Exposing the substrate to the second etch solution etches the material formed within the first feature slower than the material formed within the second feature. However, exposing the substrate to the first etch solution etches the material formed within the first feature faster than the material formed within the second feature. Thus, by exposing the substrate to the second etch solution and subsequently exposing the substrate to the first etch solution, the method described herein etches the material formed within the first feature and the material formed within the second feature at a uniform etch rate.

In some embodiments, the method described herein may further include providing a time delay between the first time period and the second time period, so that the first etch solution and the second etch solution do not mix on a surface of the substrate. In other embodiments, the second time period may partially overlap the first time period, so that mixing occurs between the first etch solution and the second etch solution on a surface of the substrate.

A wide variety of etchant chemicals may be used within the first and second etch solutions. In some embodiments, the etchant chemical may include one or more of hydrofluoric acid (HF), ammonium hydroxide (NH4OH), hydrochloric acid (HCl), hydrogen peroxide ($H_2O_2$), nitric acid ($HNO_3$), phosphoric acid ($H_3PO_4$), potassium hydroxide (KOH), Tetramethylammonium hydroxide (TMAH) and other etchant chemicals containing an anion (negatively charged ion) as the main reactive species. In other embodiments, the etchant chemical utilized within the first and second etch solutions may contain a cation (positively charged ion) as the main reactive species.

A wide variety of organic solvents may also be used within the first etch solution. Examples of organic solvents that may be included within the first etch solution include, but are not limited to, methanol ($CH_4O$), ethanol ($C_2H_6O$), isopropyl alcohol ($C_3H_8O$), benzyl alcohol ($C_7H_8O$), ethylene glycol ($C_2H_6O_2$), acetic acid ($CH_3COOH$), acetone ($C_3H_6O$), propylene carbonate ($C_4H_6O_3$), n-hexane ($C_6H_{14}$), cyclohexane ($C_6H_{12}$), diethyl ether ($C_4H_{10}O$), tetrahydrofuran ($C_4H_8O$), benzene ($C_6H_6$), toluene ($C_7H_8$), dichloromethane ($CH_2Cl_2$), trichloroethylene ($C_2HCl_3$), 1,1,1-trichloroethane ($C_2H_3Cl_3$), 1,2-dichloroethane ($C_2H_4Cl_2$), N-methyl-2-pyrrolidone ($C_5H_9NO$), dimethyl sulfoxide ($C_2H_6OS$), ethyl lactate ($C_5H_{10}O_3$), ethanolamine ($C_2H_7NO$) and propylene glycol methyl ether acetate ($C_6H_{12}O_3$). In some embodiments, the organic solvent included within the first etch solution may be isopropyl alcohol ($C_3H_8O$), propylene carbonate ($C_4H_6O_3$), acetic acid ($CH_3COOH$) or ethylene glycol ($C_2H_6O_2$).

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIGS. 6A-6D illustrate one embodiment of a wet etch process that may be used to provide uniform etch rate within features having different CD by exposing a substrate on which the features are formed to an aqueous-based etch solution and a non-aqueous organic-based etch solution in series;

FIGS. 7A-7D illustrate another embodiment of a wet etch process that may be used to provide uniform etch rate within features having different CD by exposing a substrate on which the features are formed to an aqueous-based etch solution and a non-aqueous organic-based etch solution in series;

FIGS. 11A-11C illustrate one embodiment of a wet etch process that may be used to provide uniform etch rate within features (e.g., trenches or holes) having different CD by exposing a substrate on which the features are formed to a single etch solution comprising one or more etchant chemicals, an aqueous solvent and an organic solvent;

FIG. 13 is a flowchart diagram illustrating one embodiment of a method of etching that utilizes the techniques described herein; and FIG. 14 is a flowchart diagram illustrating another embodiment of a method of etching that utilizes the techniques described herein.

DETAILED DESCRIPTION

The present disclosure provides various embodiments of a wet etch process and method to provide uniform etching of material, which is formed within features (such as, e.g., trenches, holes, slits, etc.) having different critical dimension (CD). When an etch solution is used to remove the material within the features, the rate at which the material is removed from one or more of the features (i.e., the etch rate) may differ depending on a variety of factors, such as the CD of the features, the etchant chemical(s) used within the etch solution, the solvent used within the etch solution, the ratio of etchant chemical(s) to solvent used within the etch solution, the pH of the etch solution and the wall material adjacent to the material being etched. The difference in etch rate across features of different CD is known in the art as CD-dependent etching.

The embodiments described in the present disclosure provide uniform etching of material formed within features of different CD by exposing a substrate comprising the features to an aqueous-based etch solution and a non-aqueous organic-based etch solution, either in series or in parallel. The aqueous-based etch solution is one that includes one or more etchant chemicals and an aqueous solvent. The non-aqueous organic-based etch solution, on the other hand, includes one or more etchant chemicals and an organic solvent. In some embodiments, the wet etch process and method disclosed herein may provide uniform etching of the material within the features of different CD by exposing the substrate to a single etch solution comprising one or more etchant chemicals, an aqueous solvent and an organic solvent, instead of exposing the substrate to an aqueous-based etch solution and a non-aqueous organic-based etch solution (either in series or in parallel).

Figure 1A:
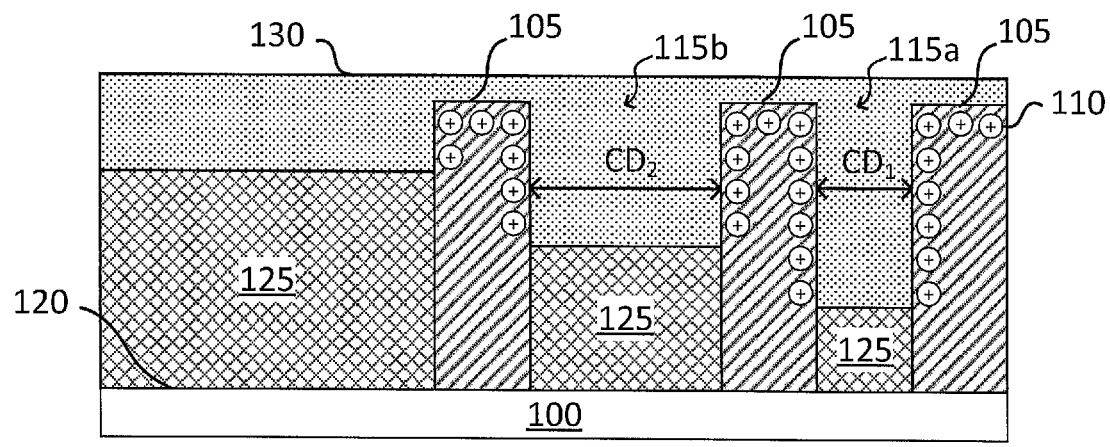
FIG. 1A is a cross-sectional view through a substrate having features of different critical dimension (CD) illustrating CD-dependent etching of material within the features when the substrate is exposed to a non-aqueous organic-based etch solution.
Figure 1B:
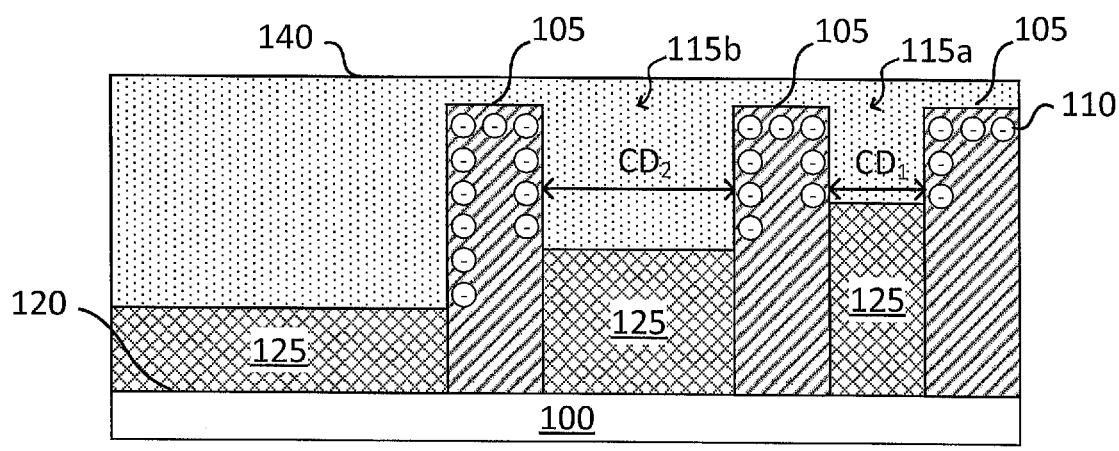
FIG. 1B is a cross-sectional view through a substrate having features of different critical dimension (CD) illustrating CD-dependent etching of material within the features when the substrate is exposed to an aqueous-based etch solution.
Figure 2:
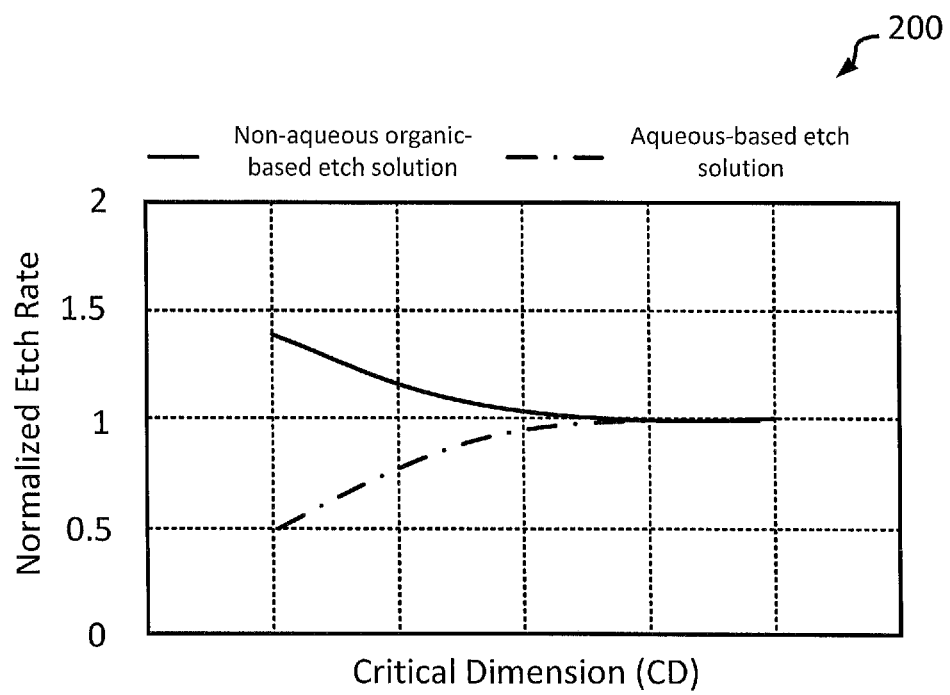
FIG. 2 is a graph illustrating normalized etch rate vs. feature CD when the substrate is exposed to a non-aqueous organic-based etch solution and an aqueous-based etch solution.

FIGS. 1A-1B and 2 illustrate CD-dependent etching of material deposited within features having different CD, and across more planar areas of a substrate, when the substrate is exposed to a non-aqueous organic-based etch solution 130 (FIGS. 1A and 2) and an aqueous-based solution 140 (FIGS. 1B and 2). As used herein, an aqueous-based etch solution 140 is a solution that includes one or more etchant chemicals mixed with an aqueous solvent (e.g., water ($H_2O$) or deionized water). A non-aqueous organic-based etch solution 130, on the other hand, is a solution that includes one or more etchant chemicals mixed with an organic solvent. In some embodiments, the non-aqueous organic-based etch solution 130 may include an etchant chemical that contains water (e.g., hydrofluoric acid (HF) containing for example 49% HF and 51% water, or ammonium hydroxide ($NH_4OH$) containing for example 29% $NH_4OH$ and 71% water, in terms of weight %) and thus, may include a minimal amount of water.

The substrate 100 shown in FIGS. 1A-1B is provided with a plurality of structures 105 (e.g., metal lines, fins, etc.) that extend above a surface of the substrate. Each of the plurality of structures 105 is separated by a feature 115 (such as, e.g., a gap, trench, hole, etc.). A critical dimension (CD) of the features 115 may be the same, or may be different, as shown in FIGS. 1A-1B. In the example embodiments shown in FIGS. 1A-1B, the substrate 100 is depicted as having a first feature 115a having a smaller CD ($CD_1$) and a second feature 115b having a larger CD ($CD_2$). The CD of the plurality of features 115 is relatively small (e.g., less than 100 nm) compared to the more planar areas 120 of the substrate 100 surrounding the plurality of structures 105.

A material 125 to be etched is deposited onto a surface of the substrate 100, the plurality of structures 105 and within the features 115 formed between the plurality of structures 105. The material 125 may include a wide variety of semiconductor materials. For example, the material 125 may be an oxide, a dielectric material, a silicon or a metal. In one example, the material 125 may be a silicon oxide (such as, e.g., silicon dioxide, $SiO_2$). Other oxide and dielectric materials, including low-k dielectric materials, may also be formed within the plurality of features 105 and etched.

In the embodiment shown in FIG. 1A, the substrate 100 is exposed to non-aqueous organic-based etch solution 130 that includes one or more etchant chemicals and an organic solvent. Examples of etchant chemicals that may be included within a non-aqueous organic-based etch solution 130 include, but are not limited to, hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH), Tetramethylammonium hydroxide (TMAH) and other etchant chemicals containing an anion (negatively charged ion) as the main reactive species.

A wide variety of organic solvents may be used within the non-aqueous organic-based etch solution 130 described herein. Examples of organic solvents that may be included within the non-aqueous organic-based etch solution 130 include, but are not limited to, various alcohols (e.g., methanol ($CH_4O$), ethanol ($C_2H_6O$), isopropyl alcohol ($C_3H_8O$), benzyl alcohol ($C_7H_8O$), etc.), polyhydric alcohols (e.g., ethylene glycol ($C_2H_6O_2$) etc.), acetic acid ($CH_3COOH$), ketones (e.g., acetone ($C_3H_6O$), propylene carbonate ($C_4H_6O_3$), etc.), alkanes (e.g., n-hexane ($C_6H_{14}$), cyclohexane ($C_6H_{12}$), etc.), ethers (e.g., diethyl ether ($C_4H_{10}O$), tetrahydrofuran ($C_4H_8O$), etc.), aromatic hydrocarbons (e.g., benzene ($C_6H_6$), toluene ($C_7H_8$), etc.), halogen compounds (e.g., dichloromethane ($CH_2Cl_2$), trichloroethylene ($C_2HCl_3$), 1,1,1-trichloroethane ($C_2H_3Cl_3$), 1,2-dichloroethane ($C_2H_4Cl_2$), etc.), nitrogen compounds (e.g., N-methyl-2-pyrrolidone ($C_5H_9NO$), etc.), sulfuric compounds (e.g., dimethyl sulfoxide ($C_2H_6OS$), etc.), and other volatile, carbon-based solvents such as ethyl lactate ($C_5H_{10}O_3$), ethanolamine ($C_2H_7NO$) and propylene glycol methyl ether acetate ($C_6H_{12}O_3$).

In some embodiments, the non-aqueous organic-based etch solution 130 may include an etchant chemical containing an anion as the main reactive species (e.g., hydrofluoric acid, ammonium hydroxide or hydrochloric acid) mixed with an alcohol (e.g., isopropyl alcohol, IPA), a polyhydric alcohol (e.g., ethylene glycol, EG), acetic acid, AA, or a ketone (e.g., propylene carbonate, PC). In at least one preferred embodiment, the non-aqueous organic-based etch solution 130 may include hydrofluoric acid mixed with IPA, AA, EG or PC. Other organic solvents described herein may also be mixed with hydrofluoric acid or other etchant chemicals (such as $NH_4OH$ or HCl) containing an anion as the main reactive species. Although the etchant chemicals described herein can be mixed with many different organic solvents, the compatibility and solubility of the etchant chemical(s) and organic solvent must be carefully considered.

When the substrate 100 is exposed to a non-aqueous organic-based etch solution 130 containing anions as the main reactive species, portions of the features 115 exposed to the non-aqueous organic-based etch solution 130 may exhibit a positive surface potential, as shown in FIG. 1A, depending on the pH of the etch solution and the wall material 110 used to form the features 115. For example, exposed portions of the features 115 may exhibit a positive surface potential (as shown in FIG. 1A) when the substrate 100 is exposed to a non-aqueous organic-based etch solution 130 containing hydrofluoric acid mixed with an organic solvent (e.g., IPA, AA, EG or PC) and the wall material 110 includes a silicon-containing material, such as amorphous silicon (a-Si), polysilicon (poly-Si), silicon nitride (SiN), silicon carbon nitride (SiCN) or silicon oxynitride (SiON).

When the substrate 100 is exposed to a non-aqueous organic-based etch solution 130, as shown in FIG. 1A and described above, the anions within the etchant chemical are attracted to the positively charged surface. This increases the local concentration of anions within the features 115, which increases the etch rate of the material 125 deposited within the features 115 compared to the more planar areas 120 of the substrate 100. Thus, the material 125 is etched faster within the plurality of features 115 and slower within the more planar areas 120 of the substrate 100 surrounding the plurality of structures 105. This is shown schematically in FIG. 1A and in the graph 200 shown in FIG. 2. When features 115 of different CD are formed within the plurality of structures 105, as shown in FIG. 1A, the increase in etch rate is more pronounced within features having smaller CD (such as feature 115a) and less pronounced within features having larger CD (such as feature 115b). However, the etch rate within the features 115 is significantly faster than the etch rate achieved across the more planar areas 120 of the substrate 100.

In the embodiment shown in FIG. 1B, the substrate 100 is exposed to an aqueous-based etch solution 140 that includes one or more etchant chemicals and an aqueous solvent. As noted above, an aqueous-based etch solution 140 is a solution that includes an etchant chemical mixed with an aqueous solvent (e.g., water ($H_2O$) or deionized water). Examples of etchant chemicals that may be included within an aqueous-based etch solution 140 include, but are not limited to, hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH), Tetramethylammonium hydroxide (TMAH) and other etchant chemicals containing an anion (negatively charged ion) as the main reactive species.

Figure 5:
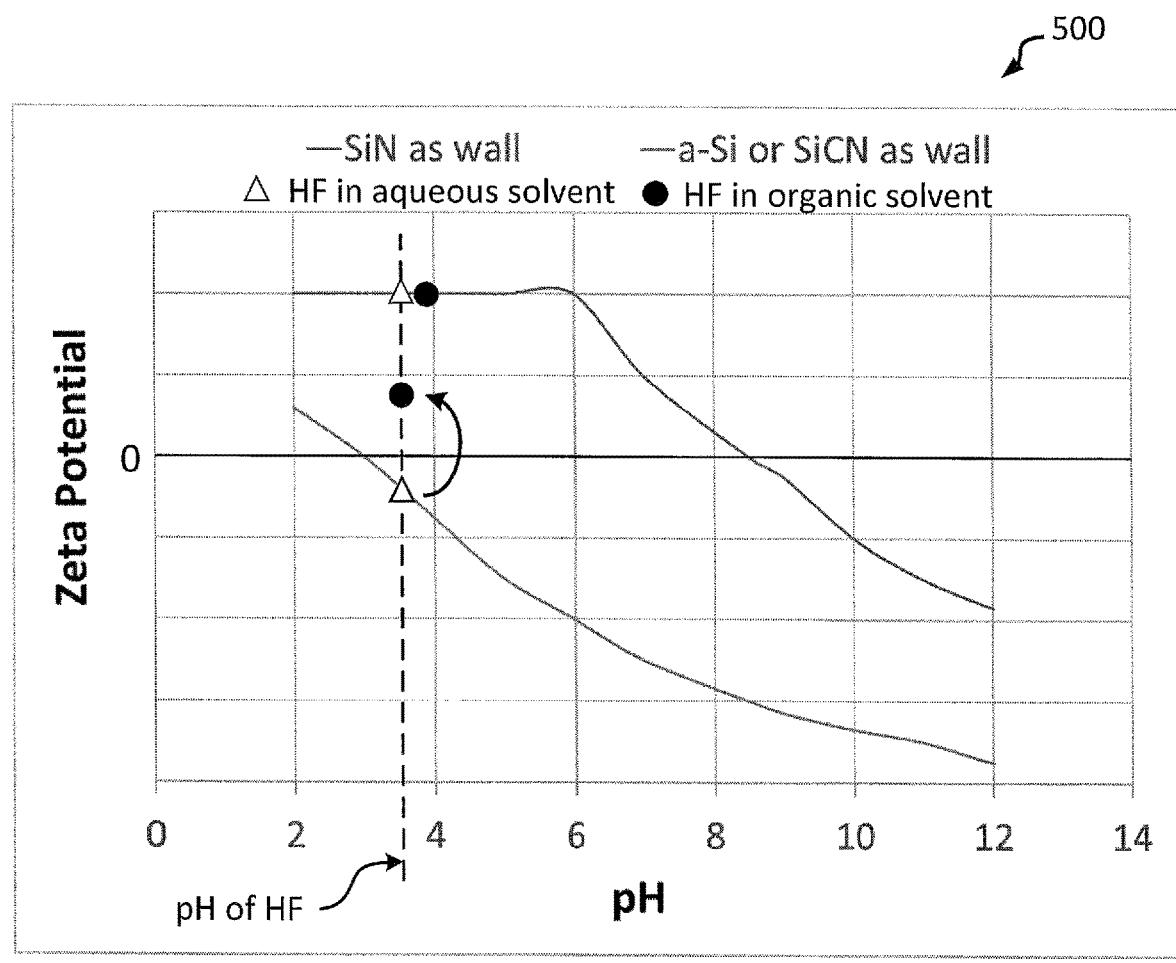
FIG. 5 is a graph illustrating Zeta potential vs pH for various etch solutions and wall materials.

When the substrate 100 is exposed to an aqueous-based etch solution 140 containing anions as the main reactive species, portions of the features 115 exposed to the aqueous-based etch solution 140 may exhibit a negative surface potential, as shown in FIG. 1B, depending on the pH of the etch solution and the wall material 110 used to form the features 115. For example, exposed portions of the features 115 may exhibit a negative surface potential (as shown in FIG. 1B) when the substrate 100 is exposed to an aqueous-based etch solution 140 containing hydrofluoric acid mixed with water and the wall material 110 includes a silicon-containing material, such as amorphous silicon (a-Si), polysilicon (poly-Si), silicon carbon nitride (SiCN) or silicon oxynitride (SiON). However, other silicon-containing materials, such as silicon nitride (SiN), may exhibit a positive surface potential (not shown in FIG. 1B) when the substrate 100 is exposed to an aqueous-based etch solution 140 containing hydrofluoric acid mixed with water. This is shown in FIG. 5 and described in more detail below.

When the substrate 100 is exposed to an aqueous-based etch solution 140, as shown in FIG. 1B and described above, the negative surface potential of the wall material 110 repels the anions within the etchant chemical to decrease its local concentration in the features 115, and thus, decrease the etch rate of the material 125 deposited within the features 115. When features 115 of different CD are formed within the plurality of structures 105, as shown in FIG. 1B, the decrease in etch rate is more pronounced in features having smaller CD (such as feature 115a) and less pronounced in features having larger CD (such as feature 115b). As a result, the material 125 is etched slower in features having smaller CD (such as feature 115a) and faster in features having larger CD (such as feature 115b). As shown in FIG. 1B, the etch rate across the more planar areas 120 of the substrate is significantly faster than the etch rate within the features 115.

When etching the material 125 formed within the plurality of features 115, the etch rate of the material 125 may depend on a variety of factors, including the critical dimension (CD) of the features 115, the particular etchant chemical(s) and/or reactive species used within the etch solution, the particular solvent used within the etch solution, the ratio of etchant chemical(s) to solvent used within the etch solution and/or the pH of the etch solution. In addition to these factors, the electric potential of the wall material 110 adjacent to the material 125 being etched may also affect the etch rate of the material 125, depending on the etch solution used.

As shown in FIGS. 1A-1B and 2, non-aqueous organic-based etch solutions 130 and aqueous-based etch solutions 140 may sometimes have the opposite effect on etch rate. When a non-aqueous organic-based etch solution 130 is used to etch the material 125, the etch rate is increased within features of smaller CD (such as feature 115a) and decreased within features of larger CD (such as feature 115b). However, the opposite is true when an aqueous-based etch solution 140 is used to etch the material 125. This may be due, at least in part, to the Zeta potential and the electric double layer (EDL) that exists between the wall material 110 and the etch solution.

Figure 3:
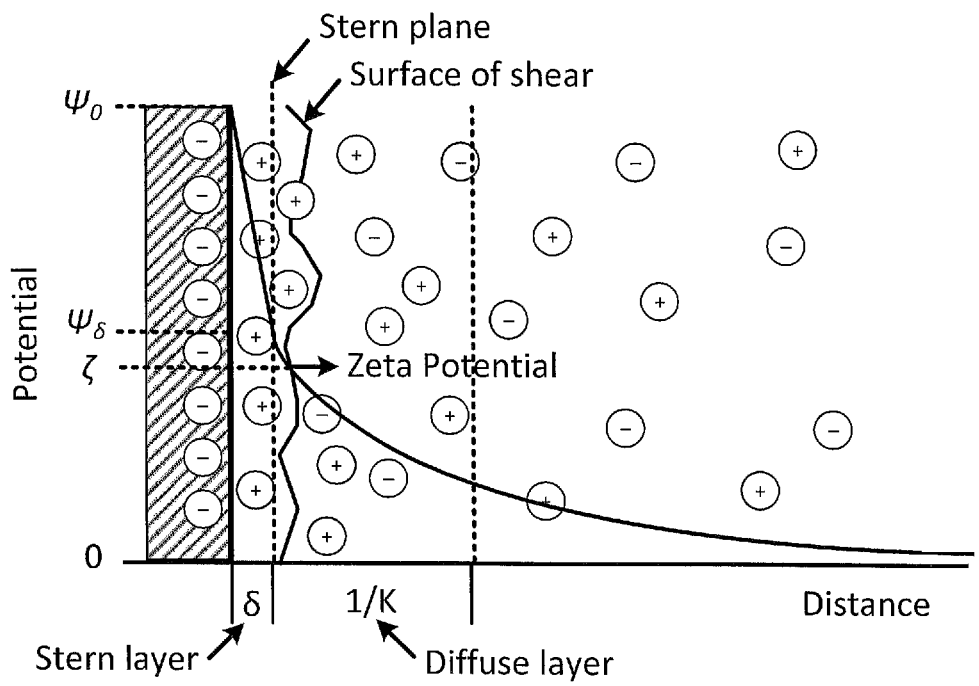
FIG. 3 is a schematic diagram illustrating the Zeta potential and the electric double layer (EDL) that exists between a charged wall surface and the etch solution.

FIG. 3 is a schematic diagram illustrating Zeta potential and the electric double layer that exists between the wall material and the etch solution. The etch solution includes cations (positively charged ions) and anions (negatively charged ions). When the etch solution comes in contact with a wall material having negative surface potential, as shown in FIG. 3, cations within the etch solution are attracted to and adsorbed onto the wall material by electrostatic and/or van der Walls forces. The opposite is true when the etch solution comes in contact with a wall material having positive surface potential (i.e., anions within the etch solution are attracted to and adsorbed onto the wall material). This attraction produces an electric double layer (i.e., a layer that does not satisfy electroneutrality) between the wall material and the etch solution.

According to the Stern model, the electric double layer (EDL) is divided into two parts separated by a plane, referred to as the Stern plane. The centers of adsorbed ions are located in the Stern layer between the wall surface and the Stern plane. Ions with centers located beyond the Stern plane form the Diffuse layer of the EDL. As shown in FIG. 3, the electric potential ($\psi$) near the wall surface changes linearly between $\psi_0$ and $\psi_\delta$ (the potential at the Stern plane) and decays exponentially with distance from $\psi_\delta$ to zero in the Diffuse layer and beyond. The Zeta potential ($\xi$) is the electric potential that exists at the Surface of Shear between the charged wall surface and the etch solution. The Zeta potential (ξ) may be positive, zero or negative, depending on the wall material and the pH of the etch solution.

Figure 4:
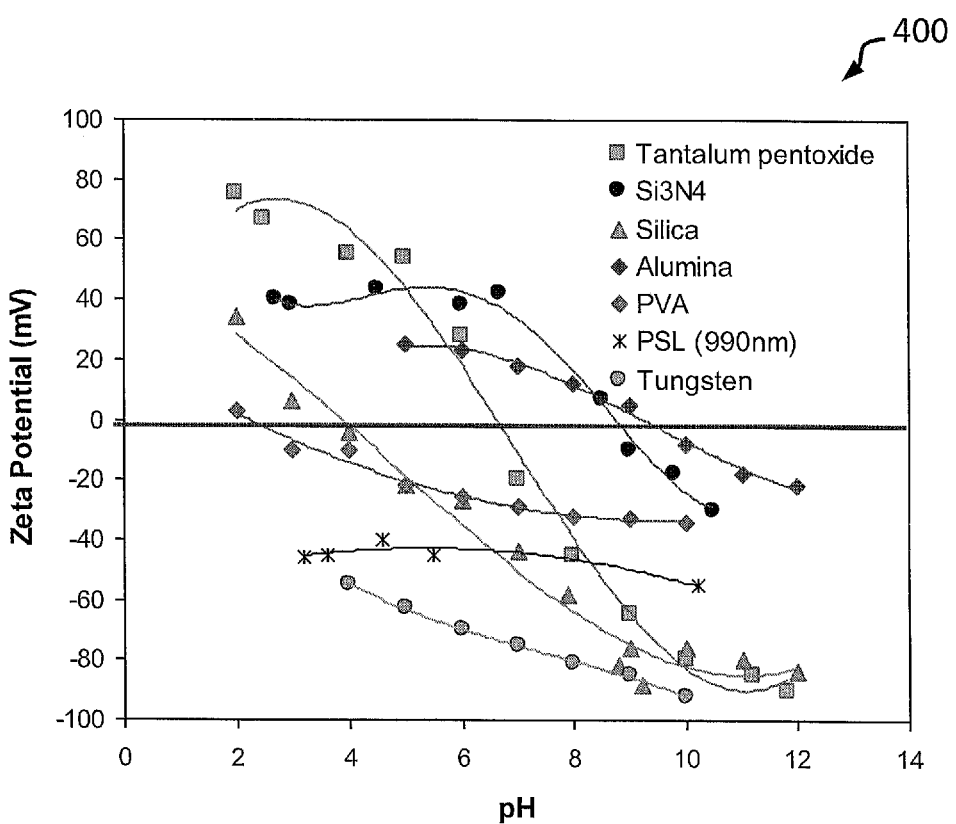
FIG. 4 is a graph illustrating Zeta potential vs pH for various wall materials.

FIG. 4 depicts a graph 400 illustrating Zeta potential (expressed in mV) vs pH for various wall materials. As shown in FIG. 4, the Zeta potential generally increases with decreasing pH and decreases with increasing pH. In some embodiments, the Zeta potential between the charged wall surface and the etch solution can be changed by changing the pH of the etch solution (e.g., by changing the etchant chemical(s) used within the etch solution, or by adding an acid or base to the etch solution), as shown in FIG. 4. In other embodiments, the Zeta potential between the charged wall surface and the etch solution can be changed by adding a surfactant to the etch solution. In yet other embodiments, the Zeta potential between the charged wall surface and the etch solution can be changed by utilizing an organic solvent, instead of an aqueous solvent, within the etch solution (depending on the pH of the etch solution). This is illustrated in the graph 500 shown in FIG. 5.

The graph 500 shown in FIG. 5 illustrates the Zeta potential vs pH for various etch solutions and wall materials (e.g., SiN, a-Si and SiCN). When hydrofluoric acid (HF) is mixed with an aqueous solvent and used as an etch solution, the Zeta potential (denoted with a Δ) between the etch solution and the wall material is: (a) negative for a-Si and SiCN (resulting in a negatively charged wall surface), and (b) positive for SiN (resulting in a positively charged wall surface). When hydrofluoric acid is mixed with organic solvent, instead of an aqueous solvent, the Zeta potential (denoted with a ·) is positive for a-Si, SiCN and SiN (resulting in positively charged wall surfaces). The graph 500 shown in FIG. 5 shows that, while organic solvents have little to no effect on the Zeta potential between an etch solution and an already positively charged wall surface, the Zeta potential between the etch solution and a negatively charged wall surface can (sometimes) be changed to a positive surface potential by using an organic solvent, instead of an aqueous solvent, within the etch solution. This difference in Zeta potential may explain, at least in part, the opposing effects that aqueous-based etch solutions and non-aqueous organic-based solutions have on etch rate when etching features having different CD.

In the graph 500 shown in FIG. 5, an organic solvent is utilized within an HF etch solution to change the Zeta potential of a negatively charged a-Si or SiCN wall surface to a positive surface potential. However, the use of an organic solvent may not be enough to shift the Zeta potential from a negative surface potential to a positive surface potential for all wall surfaces. In some cases, the pH of an organic-based etch solution can be adjusted (e.g., by changing the etchant chemical(s) used within the etch solution, or by adding an acid or base to the etch solution) to further adjust the Zeta potential, thus achieving a positive surface potential and the desired CD-dependent etch results. If the pH cannot be changed (e.g., due to compatibility concerns), a surfactant can be added to the organic-based etch solution to adjust the Zeta potential and achieve the desired CD-dependent etch results. In some cases, all three methods (organic solvent, pH tuning and surfactant addition) can be used to provide or enhance the CD-dependent trend.

In the description provided above, organic-based etch solutions are used (with or without pH tuning and surfactant addition) to increase the etch rate of material formed within features having smaller CD when: (a) the organic-based etch solution contains anions as the main reactive species, and (b) the material being etched is adjacent to a wall material that exhibits a negative surface potential in aqueous solutions. However, organic-based etch solutions may not provide the desired CD-dependent etch results in all embodiments. In some embodiments, an aqueous-based etch solution may be used to increase the etch rate of material formed within features having smaller CD when cations are used as the main reactive species. In some embodiments, the pH may be adjusted and/or a surfactant may be added to an aqueous-based etch solution containing cations as the main reactive species to provide the desired CD-dependent etch results.

As described herein, one mechanism that may cause the variation in etch rates when using the various etch solutions, various wall materials, and various CDs is a mechanism related to surface potentials. However, the techniques described herein are not strictly limited to such techniques. Thus, the CD dependent etch rates described herein may be accomplished through other mechanisms and the etch rate advantages described and obtained with the techniques provided herein are not limited to the particular surface potential mechanisms. Rather, the advantages may be obtained utilizing other mechanisms also.

The present disclosure takes advantage of the difference in etch rate that occurs when non-aqueous organic-based etch solutions and aqueous-based etch solutions are used to etch a material formed within features (e.g., trenches, holes, slits, etc.) having different CD. By combining a non-aqueous organic-based etch solution and an aqueous-based etch solution (either in series or in parallel) within a wet etch process, the disclosed embodiments utilize the opposing effects of CD-dependent etching to provide uniform etching of the material, regardless of CD. In some embodiments, the etchant chemical(s) used within the etch solution, the ratio of the etchant chemical(s) to the solvent used within the etch solution and/or the pH of the etch solution may also be selected or controlled to provide uniform etching of material formed within features of varying CD.

FIGS. 6A-6D illustrate one embodiment of a wet etch process 600 that may be used to provide uniform etch rate within features having different CD by exposing a substrate on which the features are formed to an aqueous-based etch solution and a non-aqueous organic-based etch solution in series. In some embodiments, the wet etch process 600 shown in FIGS. 6A-6D may be performed on a substrate having trenches or holes, which have different CD, such as the substrate 100 shown in FIGS. 1A and 1B.

As shown in FIG. 6A, the wet etch process 600 may generally begin (in step 610) by providing a substrate 100 having a plurality of features 115 (e.g., trenches or holes), where one or more of the features 115 have different CD. Next, the wet etch process 600 may expose the substrate 100 to an aqueous-based etch solution 140 (in step 620 of FIG. 6B) before subsequently exposing the substrate to a non-aqueous organic-based etch solution 130 (in step 630 of FIG. 6C). In some embodiments, the wet etch process 600 may expose the substrate 100 to the aqueous-based etch solution 140 during a first time period (in step 620) and may subsequently expose the substrate to the non-aqueous organic-based etch solution 130 during a second time period (in step 630), which occurs at least partially after the first time period, so as to provide a desired amount of etching during each step.

As noted above, aqueous-based etch solutions and non-aqueous organic-based etch solutions may have the opposite effect on etch rate when etching features 115 having different CD. When the substrate 100 is exposed to the aqueous-based etch solution 140 (in step 620), the features having smaller CD (such as feature 115a) are etched slower than the features having larger CD (such as feature 115b). When the substrate 100 is subsequently exposed to the non-aqueous organic-based etch solution 130 (in step 630), the features having smaller CD (such as feature 115a) are etched faster than the features having larger CD (such as feature 115b). By exposing the substrate 100 to an aqueous-based etch solution 140 and a non-aqueous organic-based etch solution 130 in series, as shown in FIGS. 6B-6C, the wet etch process 600 provides a uniform etch rate and uniform etching of the material 125 formed within the features 115, as shown in step 640 of FIG. 6D.

In the embodiment shown in FIGS. 6A-6D, the wet etch process 600 exposes the substrate 100 to the aqueous-based etch solution 140 during a first time period (in step 620) before exposing the substrate 100 to the non-aqueous organic-based etch solution 130 during a second time period (in step 630), which occurs at least partially after the first time period. In some embodiments, a time delay (or a drying step) may be provided between the first time period and the second time period, so that the aqueous-based etch solution 140 and the non-aqueous organic-based etch solution 130 do not mix on the surface of the substrate 100. In other embodiments, the second time period may partially overlap the first time period, so that mixing occurs between the aqueous-based etch solution 140 and the non-aqueous organic-based etch solution 130 on the surface of the substrate. In yet other embodiments, the substrate 100 may be exposed to the non-aqueous organic-based etch solution 130 before it is exposed to the aqueous-based etch solution 140, as shown for example in FIGS. 7A-7D.

FIGS. 7A-7D illustrate another embodiment of a wet etch process 700 that may be used to provide uniform etch rate within features having different CD by exposing a substrate on which the features are formed to an aqueous-based etch solution and a non-aqueous organic-based etch solution in series. Like the previous embodiment shown in FIGS. 6A-6D, the wet etch process 700 shown in FIGS. 7A-7D is performed on a substrate having trenches or holes, which have different CD, such as the substrate 100 shown in FIGS. 1A and 1B. Unlike the previous embodiment shown in FIGS. 6A-6D, however, the wet etch process 700 shown in FIGS. 7A-7D exposes the substrate 100 to a non-aqueous organic-based etch solution 130 before exposing the substrate 100 to an aqueous-based etch solution 140.

As shown in FIG. 7A, the wet etch process 700 may generally begin (in step 710) by providing a substrate 100 having a plurality of features 115 (e.g., trenches or holes), where one or more of the features 115 have different CD. Next, the wet etch process 700 may expose the substrate 100 to a non-aqueous organic-based etch solution 130 (in step 720 of FIG. 7B) before the substrate 100 is subsequently exposed to an aqueous-based etch solution 140 (in step 730 of FIG. 7C). The wet etch process 700 may expose the substrate 100 to the non-aqueous organic-based etch solution 130 during a first time period (in step 720) and may subsequently expose the substrate 100 to the aqueous-based etch solution 140 during a second time period (in step 730), which occurs at least partially after the first time period, so as to provide a desired amount of etching during each step.

When the substrate 100 is exposed to the non-aqueous organic-based etch solution 130 (in step 720), the features having smaller CD (such as feature 115a) are etched faster than the features having larger CD (such as feature 115b). When the substrate 100 is subsequently exposed to the aqueous-based etch solution 140 (in step 730), the features having smaller CD (such as feature 115a) are etched slower than the features having larger CD (such as feature 115b). By exposing the substrate 100 to the non-aqueous organic-based etch solution 130 and the aqueous-based etch solution 140 in series, as shown in FIGS. 7B-7C, the wet etch process 700 provides a uniform etch rate and uniform etching of the material 125 formed within the features 115, as shown in step 740 of FIG. 7D.

In the embodiment shown in FIGS. 7A-7D, the wet etch process 700 exposes the substrate 100 to the non-aqueous organic-based etch solution 130 during a first time period (in step 720) before exposing the substrate 100 to the aqueous-based etch solution 140 during a second time period (in step 730), which occurs at least partially after the first time period. In some embodiments, a time delay (or a drying step) may be provided between the first time period and the second time period, so that the non-aqueous organic-based etch solution 130 and the aqueous-based etch solution 140 do not mix on the surface of the substrate 100. In other embodiments, the second time period may partially overlap the first time period, so that mixing occurs between the non-aqueous organic-based etch solution 130 and the aqueous-based etch solution 140 on the surface of the substrate.

Figure 8:
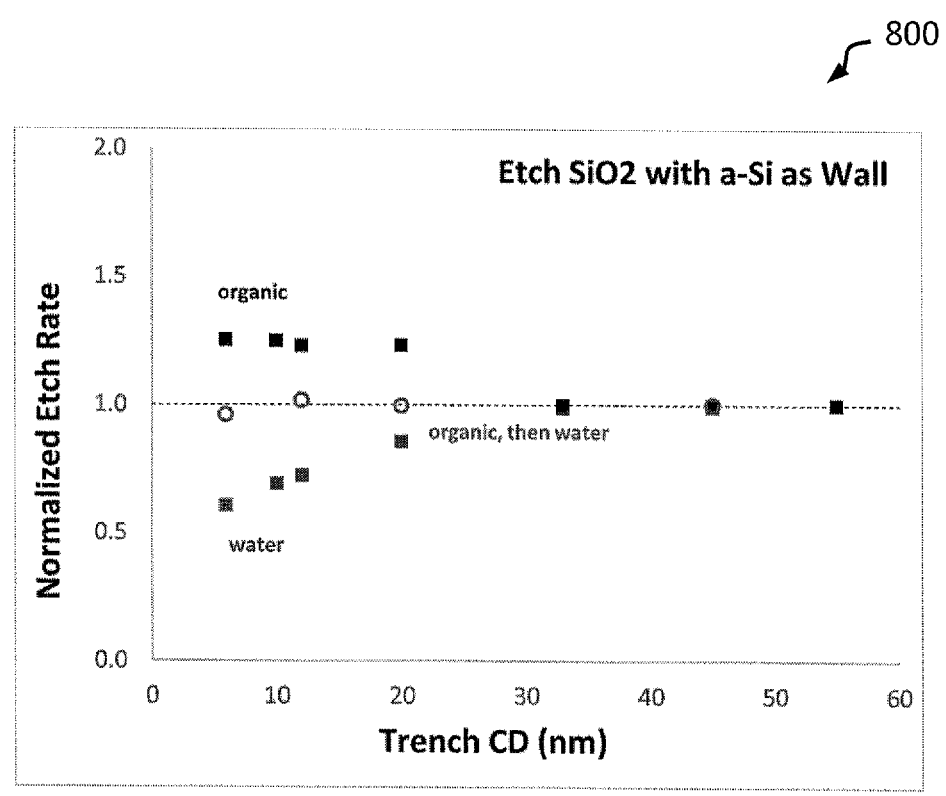
FIG. 8 is a graph illustrating a normalized etch rate vs trench CD (expressed in nm) when a non-aqueous organic-based etch solution and an aqueous-based etch solution are utilized in series, as shown in FIGS. 7A-7D, to etch a silicon dioxide ($SiO_2$) material formed within trenches of varying CD.

The graph 800 shown FIG. 8 illustrates normalized etch rate vs trench CD (expressed in nm) when an etch solution having an organic solvent (e.g., a non-aqueous organic-based etch solution 130) and an etch solution having an aqueous solvent (e.g., an aqueous-based etch solution 140) are utilized in series, as shown in FIGS. 7A-7D, to etch a silicon dioxide ($SiO_2$) material formed within trenches of varying CD. In the graph 800, the "normalized etch rate" is the ratio of the etch rate in trenches having smaller CD to the etch rate in trenches having larger CD. As shown in the graph 800, the normalized etch rate increases with decreasing CD when using an etch solution having an organic solvent, and decreases with decreasing CD when using an etch solution having an aqueous solvent. By exposing the substrate to an etch solution having an organic solvent followed by an etch solution having an aqueous solvent, the wet etch process 700 shown in FIGS. 7A-7D provides a uniform etch rate (e.g., a normalized etch rate close to "1") within the trenches of varying CD.

In the example embodiments shown in FIGS. 1A-1B, 6A-6D and 7A-7D, the etchant chemical utilized within the non-aqueous organic-based etch solution 130 and the aqueous-based etch solution 140 includes an anion (negatively charged ion) as the main reactive species. In alternative embodiments of the present disclosure (not illustrated), the etchant chemical utilized within the non-aqueous organic-based etch solution 130 and the aqueous-based etch solution 140 may contain a cation (positively charged ion) as the main reactive species. When a cation is used as the main reactive species, the non-aqueous organic-based etch solution 130 and the aqueous-based etch solution 140 may provide an etching effect, which is opposite to that which is shown in FIGS. 1A-1B, 6A-6D and 7A-7D. For example, when a cation is used as the main reactive species, the non-aqueous organic-based etch solution 130 may etch the material 125 slower in features having smaller CD (such as feature 115a) and faster in features having larger CD (such as feature 115b). Likewise, when a cation is used as the main reactive species, the aqueous-based etch solution 140 may etch the material 125 faster in features having smaller CD (such as feature 115a) and slower in features having larger CD (such as feature 115b).

In the example embodiments shown in FIGS. 1A-1B, 6A-6D and 7A-7D, the techniques described herein are used to provide uniform etching of material formed within trenches or holes of varying CD. It is recognized, however, that the techniques described herein are not strictly limited to etching material formed within trenches or holes, and may be alternatively performed on any substrate having features of varying CD.

Figure 9:
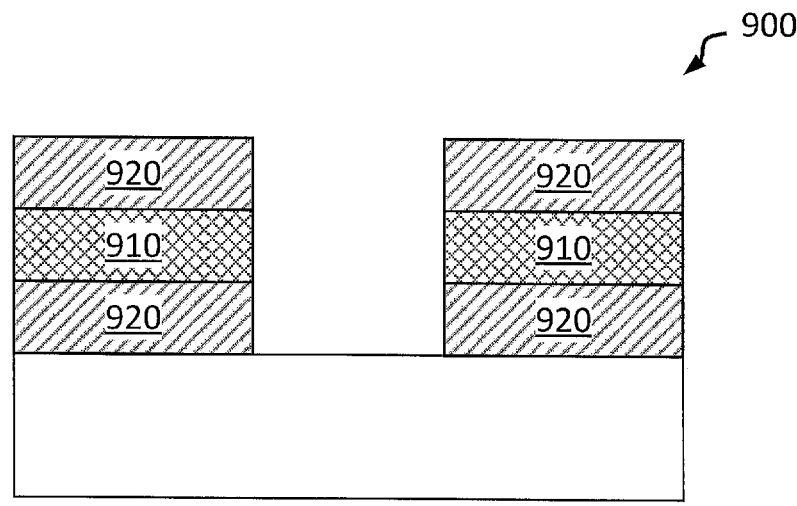
FIG. 9 is a cross-sectional view through a substrate having a silicon dioxide ($SiO_2$) nano-slit, which is sandwiched between and formed adjacent to a wall material (e.g., a-Si)
Figure 10:
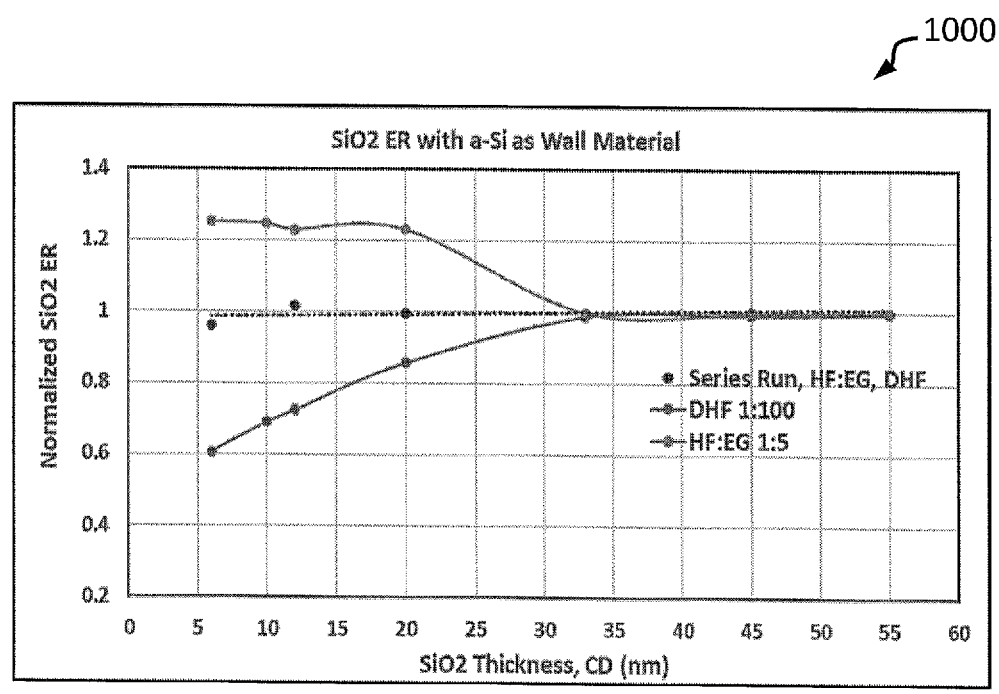
FIG. 10 is a graph illustrating normalized $SiO_2$ etch rate (ER) vs. $SiO_2$ thickness (or CD, expressed in nm) when a non-aqueous organic-based etch solution and an aqueous-based etch solution are utilized in series to etch for the $SiO_2$ nano-slit shown in FIG. 9.

For example, the techniques described herein may also be used to provide uniform etching of material formed within nano-slits of various thickness, as shown in FIGS. 9 and 10. FIG. 9 provides a cross-sectional view through a substrate 900 having a nano-slit 910, which is sandwiched between and formed adjacent to a wall material 920 (such as, e.g., a-Si, poly-Si, SiCN or SiON). In one embodiment, the nano-slit 910 may comprise silicon dioxide ($SiO_2$) and the wall material 920 may comprise amorphous silicon (a-Si). In some embodiments, a thickness, or critical dimension (CD), of the nano-slit 910 may range, for example, between 5 nm and 55 nm.

The graph 1000 shown in FIG. 10 illustrates the normalized $SiO_2$ etch rate (ER) vs. $SiO_2$ thickness (or CD, expressed in nm) when an etch solution having an organic solvent (e.g., a non-aqueous organic-based etch solution 130) and an etch solution having an aqueous solvent (e.g., an aqueous-based etch solution 140) are utilized in series to etch a $SiO_2$ nano-slit 910 of varying CD, as shown in FIG. 9. The graph 1000 shows that the normalized $SiO_2$ etch rate increases with decreasing CD when using an etch solution having an organic solvent (e.g., hydrofluoric acid (HF) mixed with ethylene glycol (EG) at a 1:5 ratio), and decreases with decreasing CD when using an etch solution having an aqueous solvent (e.g., a dilute HF solution formed by mixing HF with water at a 1:100 ratio). However, when the substrate 900 is exposed to a series run of a HF:EG solution (1:5) followed by a dilute HF solution (1:100), a uniform etch rate (e.g., a normalized etch rate close to "1") is provided within $SiO_2$ nano-slits of varying CD.

When etching a $SiO_2$ nano-slit 910 with a non-aqueous organic-based etch solution 130 and an aqueous-based etch solution 140 in series, as shown in FIGS. 9-10, the absolute etch rate of the $SiO_2$ nano-slit 910 when exposed to the aqueous-based etch solution 140 is much higher than when the $SiO_2$ nano-slit 910 is exposed to the non-aqueous organic-based etch solution 130 at the same chemical concentration. In order to provide a comparable process time for the first time period and the second time period of the series run, a higher chemical concentration is used in the non-aqueous organic-based etch solution 130.

The wet etch processes described thus far have exposed a substrate to an aqueous-based etch solution and a non-aqueous organic-based etch solution in series to provide uniform etching of material within features of varying CD. It is recognized, however, that the techniques described herein are not strictly limited to a wet etch process, which expose a substrate to an aqueous-based etch solution and a non-aqueous organic-based etch solution in series. In one alternative embodiment, a wet etch process in accordance with the present disclosure may expose a substrate to an aqueous-based etch solution and a non-aqueous organic-based etch solution in parallel, such that the aqueous-based etch solution and the non-aqueous organic-based etch solution are provided to the substrate at substantially the same time or during overlapping time periods. In another alternative embodiment, a wet etch process in accordance with the present disclosure may expose a substrate to a single etch solution comprising one or more etchant chemicals, an aqueous solvent and an organic solvent.

FIGS. 11A-11C illustrate one embodiment of a wet etch process 1100 that may be used to provide uniform etch rate within features having different CD by exposing a substrate on which the features are formed to a single etch solution comprising one or more etchant chemicals, an aqueous solvent and an organic solvent. The wet etch process 1100 shown in FIGS. 11A-11C is performed on a substrate 100 having trenches or holes, which have different CD, such as the substrate 100 shown in FIGS. 1A and 1B. Although depicted as such, the wet etch process 1100 is not strictly limited to etching material formed within trenches or holes, and may be alternatively performed on any substrate having features of varying CD.

Like the previous embodiments shown in FIGS. 6A-6D and FIGS. 7A-7D, the wet etch process 1100 shown in FIGS. 11A-11C may generally begin (in step 1110 of FIG. 11A) by providing a substrate 100 having a plurality of features 115 (e.g., trenches or holes), where one or more of the features 115 have different CD. Next, the wet etch process 1100 may expose the substrate 100 to a single etch solution 1125 that includes one or more etchant chemicals, an aqueous solvent and an organic solvent (in step 1120 of FIG. 11B). By combining etchant chemical(s) with an aqueous solvent (which provides a slower etch rate for features with smaller CD and a faster etch rate for features with larger CD) and an organic solvent (which provides a faster etch rate for features with smaller CD and a slower etch rate for features with larger CD), the wet etch process 1100 provides a uniform etch rate and uniform etching of the material 125 formed within the features 115, as shown in step 1130 of FIG. 11C.

When combining organic and aqueous solvents, the compatibility and solubility of the organic and aqueous solvents must be considered. For example, some organic solvents cannot be mixed with water. Some organic solvents can be mixed with water at any concentration. Other organic solvents can be mixed with water up to a certain concentration (e.g., X %) after which the organic solvent is no longer soluble in water. Although a variety of organic solvents may be utilized in the techniques described herein, organic solvents such as alcohols, polyhydric alcohols and ketones may be preferred, due to their compatibility and solubility with water. In some embodiments, isopropyl alcohol (IPA), acetic acid (AA), ethylene glycol (EG) or propylene carbonate (PC) may be utilized as an organic solvent, which is mixed with one or more etchant chemicals (such as HF) and an aqueous solvent ($H_2O$) at a variety of concentrations.

Figure 12:
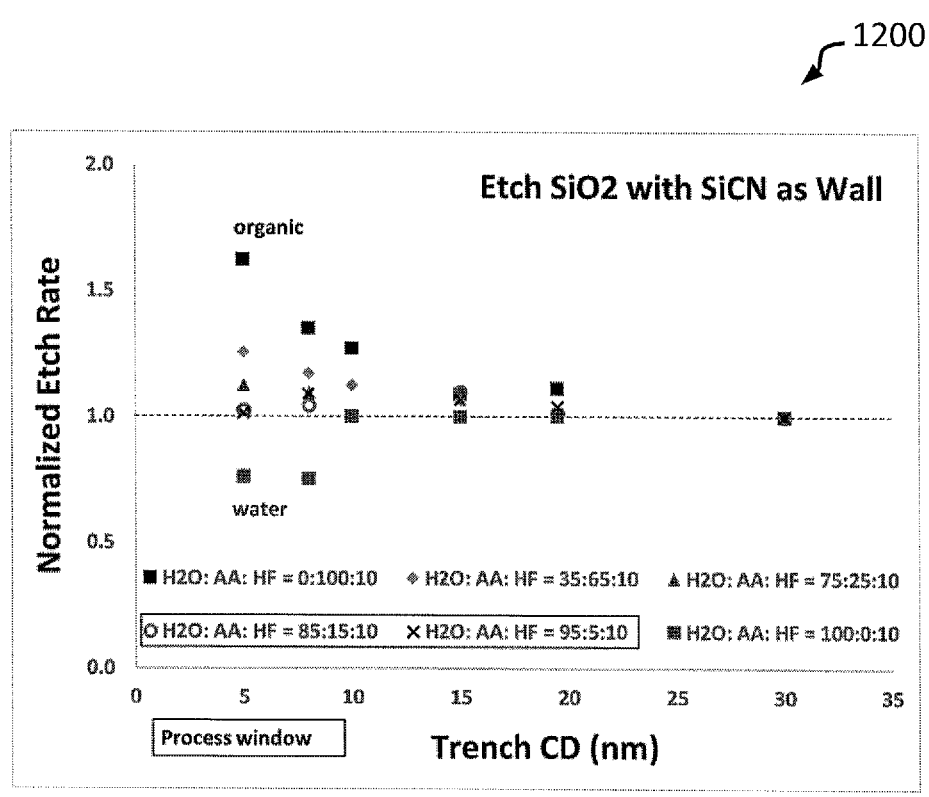
FIG. 12 is a graph illustrating normalized etch rate vs trench CD (expressed in nm) when a single etch solution having one or more etchant chemicals, an aqueous solvent and an organic solvent is used, as shown in FIGS. 11A-11C, to etch a silicon dioxide ($SiO_2$) material formed within trenches of varying CD when the $SiO_2$ material is adjacent to a SiCN wall material.

The graph 1200 shown in FIG. 12 illustrates normalized etch rate vs trench CD (expressed in nm) when a single etch solution 1125 having one or more etchant chemicals, an aqueous solvent and an organic solvent is used, as shown in FIGS. 11A-11C, to etch a silicon dioxide ($SiO_2$) material formed within trenches of varying CD when the $SiO_2$ material is adjacent to a SiCN wall material. In the graph 1200, the "normalized etch rate" is the ratio of the etch rate in trenches having smaller CD to the etch rate in trenches having larger CD. As shown in the graph 1200, the normalized etch rate increases with decreasing CD when using an etch solution having an organic solvent (e.g., $H_2O$:AA: HF=0:100:10), and decreases with decreasing CD when using an etch solution having an aqueous solvent (e.g., $H_2O$:AA:HF=100:0:10). However, when the substrate is exposed to a single etch solution 1125 having both an aqueous solvent and an organic solvent, the wet etch process 1100 shown in FIGS. 11A-11C provides a uniform etch rate (e.g., a normalized etch rate close to "1") within the trenches of varying CD.

The graph 1200 shown in FIG. 12 depicts the normalized etch rate vs trench CD for a variety of different etch solutions, which mix at least one etchant chemical with an aqueous solvent and an organic solvent. For example, the graph 1200 depicts the normalized etch rate vs trench CD for: (a) a first etch solution (denoted with ◇) that combines water ($H_2O$), acetic acid (AA) and hydrofluoric acid (HF) at a ratio of 35:65:10, (b) a second etch solution (denoted with Δ) that combines $H_2O$, AA and HF at a ratio of 75:25:10, (c) a third etch solution (denoted with ○) that combines $H_2O$, AA and HF at a ratio of 85:15:10, and (d) a fourth etch solution (denoted with x) that combines $H_2O$, AA and HF at a ratio of 95:5:10. Of these etch solutions, the third etch solution (denoted with ○) and the fourth etch solution (denoted with x) meet the process window requirements for uniform etch rate within the trenches of varying CD.

The wet etch processes disclosed herein provide uniform etching of material within features of different CD formed on a substrate. The wet etch processes disclosed herein may be utilized during the processing of a wide range of substrates. The substrate may be any substrate for which the patterning of the substrate is desirable. For example, in one embodiment, the substrate may be a semiconductor substrate having one or more semiconductor processing layers (all of which together may comprise the substrate) formed thereon. Thus, in one embodiment, the substrate may be a semiconductor substrate that has been subject to multiple semiconductor processing steps which yield a wide variety of structures, features and layers, all of which are known in the substrate processing art, and which may be considered to be part of the substrate. For example, in one embodiment, the substrate may be a semiconductor wafer having one or more semiconductor processing layers formed thereon. The concepts disclosed herein may be utilized at any stage of the substrate process flow.

FIGS. 13-14 illustrate exemplary methods that utilize the techniques described herein to provide uniform etching of material within features of different CD formed on a substrate. It will be recognized that the embodiments shown in FIGS. 13-14 are merely exemplary and additional methods may utilize the techniques described herein. Further, additional processing steps may be added to the methods shown in FIGS. 13-14 as the steps described are not intended to be exclusive. Moreover, the order of the steps is not limited to the order shown in the figures as different orders may occur and/or various steps may be performed in combination or at the same time.

FIG. 13 illustrates a method 1300 of etching, in accordance with one embodiment of the present disclosure. In some embodiments, the method 1300 shown in FIG. 13 may begin (in step 1310) by providing a substrate having a plurality of features, wherein a critical dimension (CD) of the plurality of features is different for one or more of the features. For example, the plurality of features may include at least a first feature having a smaller CD and a second feature having a larger CD.

In the embodiment shown in FIG. 13, the method 1300 exposes the substrate to one or more etch solutions in series, or in parallel, to etch a material formed within the plurality of features (in step 1320). The one or more etch solutions may generally include an etchant chemical, an aqueous solvent and an organic solvent. In the method 1300 shown in FIG. 13, the organic solvent utilized within the one or more etch solutions may be an alcohol, a polyhydric alcohol, acetic acid or a ketone. By exposing the substrate to the one or more etch solutions, either in series or in parallel, the method 1300 shown in FIG. 13 provides uniform etching of the material formed within the plurality of features, regardless of CD.

In some embodiments, the material formed within the plurality of features may be an oxide, a dielectric material, a silicon or a metal. In one example embodiment, the material formed within the plurality of features (i.e., the material to be etched) may be silicon dioxide ($SiO_2$). In some embodiments, a wall material of the plurality of features may comprise a silicon-containing material, which exhibits a negative surface potential when exposed to aqueous solutions in a certain pH range. For example, the wall material may include amorphous silicon (a-Si), polysilicon (poly-Si), silicon carbon nitride (SiCN) or silicon oxynitride (SiON).

In some embodiments, exposing the substrate to the one or more etch solutions (step 1320) may include exposing the substrate to a first etch solution comprising the etchant chemical and the organic solvent, and exposing the substrate to a second etch solution comprising the etchant chemical and the aqueous solvent.

In some embodiments, the etchant chemical may include anions as a main reactive species. When anions are utilized as the main reactive species, exposing the substrate to the first etch solution etches the material formed within the first feature faster than the material formed within the second feature, while exposing the substrate to the second etch solution etches the material formed within the first feature slower than the material formed within the second feature. Thus, by exposing the substrate to the first etch solution and exposing the substrate to the second etch solution, the material formed within the first feature and the material formed within the second feature are etched at a uniform etch rate.

In some embodiments, a wall material of the plurality of features may have a positive surface potential when the substrate is exposed to the first etch solution and a negative surface potential when the substrate is exposed to the second etch solution. For example, the wall material may include amorphous silicon (a-Si), polysilicon (poly-Si), silicon carbon nitride (SiCN) or silicon oxynitride (SiON).

When the substrate is exposed to the first etch solution, the positive surface potential attracts the anions within the etchant chemical to increase an etch rate of the material formed within the first feature and the second feature. In this case, the increase in the etch rate may be more pronounced within the first feature having the smaller CD and less pronounced within the second feature having the larger CD.

When the substrate is exposed to the second etch solution, the negative surface potential repels the anions within the etchant chemical to decrease an etch rate of the material formed within the first feature and the second feature. In this case, the decrease in the etch rate may be more pronounced within the first feature having the smaller CD and less pronounced within the second feature having the larger CD.

In other embodiments, the etchant chemical may include cations as a main reactive species, instead of anions. When cations are utilized as the main reactive species, exposing the substrate to the first etch solution etches the material formed within the first feature slower than the material formed within the second feature, while exposing the substrate to the second etch solution etches the material formed within the first feature faster than the material formed within the second feature. Thus, by exposing the substrate to the first etch solution and exposing the substrate to the second etch solution, the material formed within the first feature and the material formed within the second feature are etched at a uniform etch rate.

In some embodiments, the method 1300 may expose the substrate to the one or more etch solutions (in step 1320) in series. In some embodiments, for example, exposing the substrate to the one or more etch solutions (step 1320) may include exposing the substrate to the first etch solution during a first time period before subsequently exposing the substrate to the second etch solution during a second time period, which occurs at least partially after the first time period. In other embodiments, exposing the substrate to the one or more etch solutions (step 1320) may include exposing the substrate to the second etch solution during a first time period before subsequently exposing the substrate to the first etch solution during a second time period, which occurs at least partially after the first time period.

In other embodiments, the method 1300 may expose the substrate to the one or more etch solutions (in step 1320) in parallel. In some embodiments, for example, exposing the substrate to the one or more etch solutions (step 1320) may include exposing the substrate to the first etch solution and exposing the substrate to the second etch solution at substantially the same time or during overlapping time periods. In other embodiments, exposing the substrate to one or more etch solutions (step 1320) may include exposing the substrate to a single etch solution comprising the etchant chemical, the aqueous solvent and the organic solvent, wherein said exposing the substrate to the single etch solution etches the material within the first feature and the second feature at a uniform etch rate.

FIG. 14 illustrates a method 1400 of etching, in accordance with another embodiment of the present disclosure. Like the method 1300 shown in FIG. 13, the method 1400 shown in FIG. 14 may begin (in step 1410) by providing a substrate having a plurality of features, wherein a critical dimension (CD) of the plurality of features is different for one or more of the features. For example, the plurality of features may include at least a first feature having a smaller CD and a second feature having a larger CD.

In the embodiment shown in FIG. 14, the method 1400 exposes the substrate to a first etch solution and a second etch solution in series to etch a material formed within the plurality of features (in step 1420). The first etch solution includes an etchant chemical mixed with an organic solvent. The second etch solution includes the etchant chemical mixed with an aqueous solvent. By exposing the substrate to the first etch solution and the second etch solution in series, the method 1400 provides uniform etching of the material formed within the plurality of features, regardless of CD.

In some embodiments, exposing the substrate to the first etch solution and the second etch solution in series (step 1420) may include exposing the substrate to the first etch solution during a first time period, and subsequently exposing the substrate to the second etch solution during a second time period, which occurs at least partially after the first time period. Exposing the substrate to the first etch solution etches the material formed within the first feature faster than the material formed within the second feature. When the substrate is subsequently exposed to the second etch solution, the second etch solution etches the material formed within the first feature slower than the material formed within the second feature. Thus, by exposing the substrate to the first etch solution and subsequently exposing the substrate to the second etch solution, the method 1400 etches the material formed within the first feature and the material formed within the second feature at a uniform etch rate.

In other embodiments, exposing the substrate to the first etch solution and the second etch solution in series (step 1420) may include exposing the substrate to the second etch solution during a first time period, and subsequently exposing the substrate to the first etch solution during a second time period, which occurs at least partially after the first time period. Exposing the substrate to the second etch solution etches the material formed within the first feature slower than the material formed within the second feature. However, exposing the substrate to the first etch solution etches the material formed within the first feature faster than the material formed within the second feature. Thus, by exposing the substrate to the second etch solution and subsequently exposing the substrate to the first etch solution, the method 1400 etches the material formed within the first feature and the material formed within the second feature at a uniform etch rate.

In some embodiments, the method 1400 shown in FIG. 14 may further include providing a time delay between the first time period and the second time period, so that the first etch solution and the second etch solution do not mix on a surface of the substrate. In other embodiments, the second time period may partially overlap the first time period, so that mixing occurs between the first etch solution and the second etch solution on a surface of the substrate.

A wide variety of etchant chemicals may be used within the first and second etch solutions in the embodiments shown in FIGS. 13 and 14. In some embodiments, the etchant chemical may include one or more of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH), Tetramethylammonium hydroxide (TMAH) and other etchant chemicals containing an anion (negatively charged ion) as the main reactive species. In other embodiments, the etchant chemical utilized within the first and second etch solutions may contain a cation (positively charged ion) as the main reactive species.

A wide variety of organic solvents may also be used within the first etch solution. Examples of organic solvents that may be included within the first etch solution include, but are not limited to, methanol ($CH_4O$), ethanol ($C_2H_6O$), isopropyl alcohol ($C_3H_8O$), benzyl alcohol ($C_7H_8O$), ethylene glycol ($C_2H_6O_2$), acetic acid ($CH_3COOH$), acetone ($C_3H_6O$), propylene carbonate ($C_4H_6O_3$), n-hexane ($C_6H_{14}$), cyclohexane ($C_6H_{12}$), diethyl ether ($C_4H_{10}O$), tetrahydrofuran ($C_4H_8O$), benzene ($C_6H_6$), toluene ($C_7H_8$), dichloromethane ($CH_2Cl_2$), trichloroethylene ($C_2HCl_3$), 1,1,1-trichloroethane ($C_2H_3Cl_3$), 1,2-dichloroethane ($C_2H_4Cl_2$), N-methyl-2-pyrrolidone ($C_5H_9NO$), dimethyl sulfoxide ($C_2H_6OS$), ethyl lactate ($C_5H_{10}O_3$), ethanolamine ($C_2H_7NO$) and propylene glycol methyl ether acetate ($C_6H_{12}O_3$). In some embodiments, the organic solvent used within the first etch solution may be isopropyl alcohol ($C_3H_8O$), propylene carbonate ($C_4H_6O_3$), acetic acid ($CH_3COOH$) or ethylene glycol ($C_2H_6O_2$).

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures, features or regions formed thereon. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Wet etch processes and methods for processing a substrate are described in various embodiments. The substrate may include any material portion or structure of a device, particularly a semiconductor or other electronics device, and may, for example, be a base substrate structure, such as a semiconductor substrate or a layer on or overlying a base substrate structure such as a thin film. Thus, the term "substrate" is not intended to be limited to any particular base structure, underlying layer or overlying layer, patterned or unpatterned, but rather, is contemplated to include any such layer or base structure, and any combination of layers and/or base structures.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described wet etch processes and methods will be apparent to those skilled in the art in view of this description. It will be recognized, therefore, that the described wet etch processes and methods are not limited by the examples described herein. It is to be understood that the forms of the processes and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method of etching, the method comprising:
providing a substrate having a plurality of features, wherein a critical dimension (CD) of the plurality of features is different for one or more of the features, such that the plurality of features comprise at least a first feature having a smaller CD and a second feature having a larger CD; and
exposing the substrate to a plurality of different etch solutions in series to etch a material formed within the plurality of features, wherein the plurality of different etch solutions each comprise one or more of an etchant chemical, an aqueous solvent and an organic solvent, and wherein the organic solvent is an alcohol, a polyhydric alcohol, acetic acid, or a ketone, and
wherein said exposing the substrate to the plurality of different etch solutions in series provides uniform etching of the material formed within the plurality of features, regardless of CD.

2. The method of claim 1, wherein the etchant chemical comprises anions as a main reactive species, and wherein said exposing the substrate to the plurality of different etch solutions comprises:
exposing the substrate to a first etch solution comprised of the etchant chemical and the organic solvent, wherein said exposing the substrate to the first etch solution etches the material formed within the first feature faster than the material formed within the second feature;
exposing the substrate to a second etch solution comprised of the etchant chemical and the aqueous solvent, wherein said exposing the substrate to the second etch solution etches the material formed within the first feature slower than the material formed within the second feature; and
wherein said exposing the substrate to the first etch solution and said exposing the substrate to the second etch solution etches the material formed within the first feature and the material formed within the second feature at a uniform etch rate.

3. The method of claim 2, wherein the etchant chemical comprises one or more of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH), wherein the aqueous solvent is water, and wherein the organic solvent is isopropyl alcohol ($C_3H_8O$), propylene carbonate ($C_4H_6O_3$), acetic acid ($CH_3COOH$) or ethylene glycol ($C_2H_6O_2$).

4. The method of claim 2, wherein said exposing the substrate to the first etch solution increases an etch rate of the material formed within the first feature and the second feature, wherein the increase in the etch rate is more pronounced within the first feature having the smaller CD and less pronounced within the second feature having the larger CD.

5. The method of claim 2, wherein said exposing the substrate to the second etch solution decreases an etch rate of the material formed within the first feature and the second feature, wherein the decrease in the etch rate is more pronounced within the first feature having the smaller CD and less pronounced within the second feature having the larger CD.

6. The method of claim 2, wherein said exposing the substrate to the plurality of different etch solutions comprises exposing the substrate to the first etch solution during a first time period before subsequently exposing the substrate to the second etch solution during a second time period, which occurs at least partially after the first time period.

7. The method of claim 2, wherein said exposing the substrate to the plurality of different etch solutions comprises exposing the substrate to the second etch solution during a first time period before subsequently exposing the substrate to the first etch solution during a second time period, which occurs at least partially after the first time period.

8. The method of claim 2, wherein said exposing the substrate to the plurality of different etch solutions comprises exposing the substrate to the first etch solution and exposing the substrate to the second etch solution at substantially the same time or during overlapping time periods.

9. The method of claim 1, wherein the etchant chemical comprises cations as a main reactive species, and wherein said exposing the substrate to the plurality of different etch solutions comprises:
    exposing the substrate to a first etch solution comprised of the etchant chemical and the organic solvent, wherein said exposing the substrate to the first etch solution etches the material formed within the first feature slower than the material formed within the second feature;
    exposing the substrate to a second etch solution comprised of the etchant chemical and the aqueous solvent, wherein said exposing the substrate to the second etch solution etches the material formed within the first feature faster than the material formed within the second feature; and
    wherein said exposing the substrate to the first etch solution and said exposing the substrate to the second etch solution etches the material formed within the first feature and the material formed within the second feature at a uniform etch rate.

10. The method of claim 1, wherein the etchant chemical comprises one or more of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH), wherein the aqueous solvent is water, and wherein the organic solvent is isopropyl alcohol ($C_3H_8O$), propylene carbonate ($C_4H_6O_3$), acetic acid ($CH_3COOH$) and ethylene glycol ($C_2H_6O_2$).

11. The method of claim 1, wherein the material formed within the plurality of features comprises an oxide, a dielectric material, a silicon or a metal.

12. A method of etching, the method comprising:
    providing a substrate having a plurality of features wherein a critical dimension (CD) of the plurality of features is different for one or more of the features, such that the plurality of features comprise at least a first feature having a smaller CD and a second feature having a larger CD; and
    exposing the substrate to a first etch solution and a second etch solution in series to etch a material formed within the plurality of features,
    wherein the first etch solution includes an etchant chemical mixed with an organic solvent,
    wherein the second etch solution includes the etchant chemical mixed with an aqueous solvent, and
    wherein said exposing the substrate to the first etch solution and the second etch solution in series provides uniform etching of the material formed within the plurality of features, regardless of CD.

13. The method of claim 12, wherein said exposing the substrate to the first etch solution and the second etch solution in series comprises:
    exposing the substrate to the first etch solution during a first time period, wherein said exposing the substrate to the first etch solution etches the material formed within the first feature faster than the material formed within the second feature;
    subsequently exposing the substrate to the second etch solution during a second time period, which occurs at least partially after the first time period, wherein said subsequently exposing the substrate to the second etch solution etches the material formed within the first feature slower than the material formed within the second feature; and
    wherein said exposing the substrate to the first etch solution and said subsequently exposing the substrate to the second etch solution etches the material formed within the first feature and the material formed within the second feature at a uniform etch rate.

14. The method of claim 13, further comprising providing a time delay between the first time period and the second time period, so that the first etch solution and the second etch solution do not mix on a surface of the substrate.

15. The method of claim 13, wherein the second time period partially overlaps the first time period, so that mixing occurs between the first etch solution and the second etch solution on a surface of the substrate.

16. The method of claim 12, wherein said exposing the substrate to the first etch solution and the second etch solution in series comprises:
    exposing the substrate to the second etch solution during a first time period, wherein said exposing the substrate to the second etch solution etches the material formed within the first feature slower than the material formed within the second feature;
    subsequently exposing the substrate to the first etch solution during a second time period, which occurs at least partially after the first time period, wherein said exposing the substrate to the first etch solution etches the material formed within the first feature faster than the material formed within the second feature; and
    wherein said exposing the substrate to the second etch solution and said subsequently exposing the substrate to the first etch solution etches the material formed within the first feature and the material formed within the second feature at a uniform etch rate.

17. The method of claim 16, further comprising providing a time delay between the first time period and the second time period, so that the first etch solution and the second etch solution do not mix on a surface of the substrate.

18. The method of claim 16, wherein the second time period partially overlaps the first time period, so that mixing occurs between the first etch solution and the second etch solution on a surface of the substrate.

19. The method of claim 12, wherein the etchant chemical comprises one or more of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH).

20. The method of claim 12, wherein the organic solvent comprises one or more of methanol ($CH_4O$), ethanol ($C_2H_6O$), isopropyl alcohol ($C_3H_8O$), benzyl alcohol ($C_7H_8O$), ethylene glycol ($C_2H_6O_2$), acetic acid ($CH_3COOH$), acetone ($C_3H_6O$), propylene carbonate ($C_4H_6O_3$), n-hexane ($C_6H_{14}$), cyclohexane ($C_6H_{12}$), diethyl ether ($C_4H_{10}O$), tetrahydrofuran ($C_4H_8O$), benzene ($C_6H_6$), toluene ($C_7H_8$), dichloromethane ($CH_2Cl_2$), trichloroethylene ($C_2HCl_3$), 1,1,1-trichloroethane ($C_2H_3Cl_3$), 1,2-dichloroethane ($C_2H_4Cl_2$), N-methyl-2-pyrrolidone ($C_5H_9NO$), dimethyl sulfoxide ($C_2H_6OS$), ethyl lactate ($C_5H_{10}O_3$), ethanolamine ($C_2H_7NO$) and propylene glycol methyl ether acetate ($C_6H_{12}O_3$).

\* \* \* \* \*